(12) United States Patent
Dueber et al.

(10) Patent No.: US 7,579,134 B2
(45) Date of Patent: Aug. 25, 2009

(54) POLYIMIDE COMPOSITE COVERLAYS AND METHODS AND COMPOSITIONS RELATING THERETO

(75) Inventors: Thomas Eugene Dueber, Wilmington, DE (US); Brian C. Auman, Pickerington, OH (US); Kuppusamy Kanakarajan, Dublin, OH (US)

(73) Assignee: E. I. Dupont de Nemours and Company, Wilmington, DE (US)

( * ) Notice: Subject to any disclaimer, the term of this patent is extended or adjusted under 35 U.S.C. 154(b) by 403 days.

(21) Appl. No.: 11/080,608

(22) Filed: Mar. 15, 2005

(65) Prior Publication Data

US 2006/0210819 A1 Sep. 21, 2006

(51) Int. Cl.
G03F 7/028 (2006.01)
G03F 7/032 (2006.01)
(52) U.S. Cl. ............... 430/283.1; 428/458; 428/473.5; 430/281.1; 430/906; 430/916; 430/926
(58) Field of Classification Search .......... 428/458, 428/473.5; 430/281.1, 283.1, 906, 916, 926
See application file for complete search history.

(56) References Cited

U.S. PATENT DOCUMENTS

| | | |
|---|---|---|
| 2,850,445 A | 9/1958 | Oster |
| 2,875,047 A | 2/1959 | Oster |
| 3,074,974 A | 1/1963 | Gebura |
| 3,097,096 A | 7/1963 | Oster |
| 3,097,097 A | 7/1963 | Oster |
| 3,145,104 A | 8/1964 | Oster et al. |
| 3,390,996 A | 7/1968 | MacLachlan |
| 3,427,161 A | 2/1969 | Laridon |
| 3,479,185 A | 11/1969 | Chambers |
| 3,549,367 A | 12/1970 | Chang et al. |
| 3,554,753 A | 1/1971 | Cohen |
| 3,563,750 A | 2/1971 | Walker |
| 3,563,751 A | 2/1971 | Cohen |
| 3,579,339 A | 5/1971 | Chang et al. |
| 3,622,334 A | 11/1971 | Hurley |
| 3,645,772 A | 2/1972 | Lester et al. |
| 3,647,467 A | 3/1972 | Grubb |
| 3,652,275 A | 3/1972 | Baum et al. |
| 3,784,557 A | 1/1974 | Cescon |
| 4,064,287 A | 12/1977 | Lipson et al. |
| 4,071,367 A | 1/1978 | Collier et al. |
| 4,127,436 A | 11/1978 | Friel |
| 4,162,162 A | 7/1979 | Dueber |
| 4,168,982 A | 9/1979 | Pazos |
| 4,230,793 A | 10/1980 | Losert et al. |
| 4,268,667 A | 5/1981 | Anderson |
| 4,311,783 A | 1/1982 | Dessauer |
| 4,341,860 A | 7/1982 | Sysak |
| 4,351,893 A | 9/1982 | Anderson |
| 4,376,815 A | 3/1983 | Oddi et al. |
| 4,454,218 A | 6/1984 | Dueber et al. |
| 4,535,052 A | 8/1985 | Anderson |
| 4,565,769 A | 1/1986 | Dueber et al. |
| 4,622,286 A | 11/1986 | Sheets |
| 4,710,262 A | 12/1987 | Weed |
| 4,772,534 A | 9/1988 | Kawamura et al. |
| 4,772,541 A | 9/1988 | Gottschalk et al. |
| 4,774,163 A | 9/1988 | Higashi |
| 5,336,925 A | 8/1994 | Moss et al. |

OTHER PUBLICATIONS

D.F. Eaton, Dye Sensitized Photopolymerization, Adv. In Photochemistry, vol. 13, 1986, pp. 427-487.

Primary Examiner—Ana L Woodward

(57) ABSTRACT

The present invention is directed to coverlay compositions derived from two-layer polyamic acid-based composites having a cover layer and adjacent thereto an adhesive layer wherein the cover layer comprises polyamic acid and other additives allowing the composition to be photosensitive and aqueous base developable, and where the adhesive layer can form a polyimide having a glass transition temperature between 170 and 250° C. The two-layer coverlay compositions of the present invention are used to encapsulate metal circuit traces formed on a flexible printed circuit base substrate. These two-layer compositions are particularity useful due to having an overall in-plane CTE between 10 and 40 ppm/° C. a range that is useful in avoiding unwanted curling of a flexible printed circuit when used as a polyimide-based coverlay material.

12 Claims, No Drawings

POLYIMIDE COMPOSITE COVERLAYS AND METHODS AND COMPOSITIONS RELATING THERETO

BACKGROUND OF THE INVENTION

1. Field of the Invention

The present invention relates generally to coverlay substrates typically applied to a circuitized electronic substrate and thereafter modified by photolithography or the like. More specifically, the coverlays of the present invention comprise a multilayer composite containing a polyimide (or precursor thereto) based adhesive layer and a polyimide (or precursor thereto) based support layer, where the two layers combine to provide improved coverlay performance, such as reduced (unwanted) curl when bonded to "large surface area" flexible circuits.

2. Discussion of the Related Art

U.S. Pat. No. 5,336,925 to Moss et al. teaches "positive-working" photosensitive polyamic acids and compositions derived therefrom. Such compositions, when used as a circuit coverlay material, can exhibit undue curl of the circuit after bonding and curing, particularly for "large surface area" flexible circuits that are becoming increasingly prevalent in the industry.

SUMMARY OF THE INVENTION

The present invention is directed to coverlay type compositions containing a multi-layer composite having at least an adhesive layer and a cover layer, where:

(A) the adhesive layer comprises: i. ultimately, a polyimide base polymer having a glass transition temperature ("Tg") between and including any two of the following temperatures 170, 180, 190, 200, 210, 220, 230, 240 and 250° C.; and ii. initially (prior to imidization), a polyamic acid precursor to the above described adhesive layer polyimide base polymer, the polyamic acid being present in an amount between 60 to 85 weight percent, based upon solids content;

(B) the cover layer comprises: i. ultimately, a polyimide base polymer having a glass transition temperature at least 10, 15, 25, 50, 75, or 100° C. greater than the glass transition temperature of the adhesive layer polyimide base polymer; and ii. initially, a polyamic acid precursor to such cover layer polyimide base polymer, where the polyamic acid precursor (prior to imidization) is provided in an amount between 60 to 85 weight percent, based upon solids content;

(C) the polyamic acid of the cover layer has a weight-average molecular weight equal to or below 50,000, preferably in a range between and including any two of the following weight average molecular weights: 10,000, 15,000, 20,000, 25,000, 30,000, 35,000, 40,000, 45,000 and 50,000 10,000 and 50,000;

(D) the polyamic acid of the cover layer (and optionally the adhesive layer) can additionally contain from 15 to 35 percent by weight (on a dry solids basis) an ethylenically unsaturated photo-monomer where at least 2 percent by weight of the photo-monomer is an amine acrylate, a methacrylate having amine functionality, a combination of the two, or the like;

(E) the polyamic acid of the cover layer (and optionally the adhesive layer) can additionally contain from 1 to 10 percent by weight, on a dry solids basis, of a photoinitiator; and (F) the polyamic acid of the cover layer (and optionally the adhesive layer) can additionally contain from 0.1 to 1.0 percent by weight (on a dry solids basis) a visible light sensitizer, preferably developable in 1% aqueous sodium carbonate solution.

Initially, the cover layer and the adhesive layer form a two-layer polyamic-acid based composition for typical application upon a circuitized substrate. Thereafter, the coverlay can be patterned by photoimaging and then the pattern can be removed by aqueous development. Once the coverlay is developed, it can then be thermally cured (imidized) to provide a two-layer polyimide-based composition, wherein the in-plane coefficient of thermal expansion of the rigid two-layer polyimide is sufficiently complementary to allow an overall in-plane coefficient of thermal expansion ("CTE"), e.g., between 10 and 40 ppm/° C. measured at 30° C., which is sufficiently similar to a circuitized substrate thus inhibiting unwanted curling.

The final two-layer polyimide-based compositions of the present invention will generally comprise a cover layer portion having a thickness of between and including any two of the following: 10, 20, 30, 40, 50, 60, 70, and 75 microns. In addition, the adhesive layer will generally have a thickness of between and including any two of the following: 1, 2, 5, 8, 10, 12, 15, 18, and 20 microns.

DETAILED DESCRIPTION OF THE PREFERRED EMBODIMENT(S)

In one embodiment, the present invention comprises a two-layer polyimide-based coverlay composition, having an adhesive layer and a cover layer, where the adhesive layer serves as a bonding layer to attach the composition to a flexible printed circuit or the like. The cover layer typically serves as a mechanically tough, chemically resistant, protective layer. The cover layer can also be used to alter, or adjust, the total in-plane coefficient of thermal expansion ("CTE") of the two-layer polyimide composite.

In one embodiment, the polyimide adhesive layer of the present invention has a sufficiently high in-plane coefficient of thermal expansion ("CTE") that generally causes unwanted curling when applied to a circuitized substrate (i.e. when directly bonded to a flexible printed circuit as a coverlay), because the intended flexible printed circuits are generally formed on a base substrate material having a much lower CTE value than a typical polyimide adhesive. An undue difference in CTE of these two substrates generally causes unwanted curling of a flexible printed circuit, due to temperature fluctuations during downstream use. To address this curling problem, an appropriate cover layer is chosen for use in conjunction with the adhesive layer to lower the overall CTE of the combined two-layer coverlay composite. The lower coefficient of thermal expansion (CTE) of the two-layer polyimide composite can then be matched with the CTE of a typical base substrate that is used to support the metal circuit traces of a flexible printed circuit.

In one embodiment, the two-layer polyamic acid coverlay compositions of the present invention are photosensitive and aqueous-base developable. The coverlay is applied when the adhesive layer, and cover layer, are in a pre-imidized (polyamic acid) state. The coverlay can then be photoimaged and portions (of the coverlay) washed away depending upon the presence or absence of photoimaging light during imaging (and the presence or absence of a chemical reaction induced by such light) to provide a precise coverlay pattern upon the flexible circuit. In such an embodiment, the patterned coverlay is then heated to imidize the polyamic acid into a polyimide, thereby improving mechanical strength, chemical resistance and the like. In one embodiment, once cured (i.e. imidized) the resulting two-layer polyimide composite provides an in-plane coefficient of linear expansion ("CTE") between and including any two of the following numbers 10 12, 14, 16, 18 and 20 ppm/° C. to 25, 30, 35 and 40 ppm/° C. measured at 30° C.

As used herein, the term 'developable' means a material that, upon a patterned exposure to photoimaging light, provides portions (depending upon the patterned exposure) resistant to (i.e. not easily removed chemically) removal by an aqueous base (e.g., 1 wt % sodium carbonate) solution. In one embodiment, developability (of the materials of the present invention) is generally achieved by chemical crosslinking via exposure to light energy. The development of these materials (i.e. exposure to light energy) generally allows the cross linked (i.e. light exposed) portions to then survive (i.e. not dissolve), while the non-cross linked (i.e. unexposed) portions can generally be washed away in a subsequent washing step. After development (including washing), the remaining coverlay can then be cured (imidized), typically with heat energy, to form a two-layer polyimide-based coverlay composition.

In one embodiment, the adhesive layer initially comprises a polyamic acid that can be imidized to form a thermoplastic polyimide that can form much stronger (i.e. and more permanent) bonds to the electronic substrate, often to a bond strength of greater than 2, 4, 6, 8 or 10 pounds force per linear inch (PLI). Such bond values are generally highly suitable in flexible circuitry coverlay applications.

In one embodiment of the present invention, the cover layer (and optionally, the adhesive layer) includes photosensitive additives, since the polyimide chemistry in such embodiments are not generally photosensitive by themselves. These other additives can form "polyamic acid-based" compositions that are not only photosensitive, but are also aqueous base developable. In such an embodiment, the cover layer can comprise:
  (i) from 60 to 85 weight-percent polyamic acid (on a percent solids basis), the polymer having a weight average molecular weight of from 10,000 to 50,000;
  (ii) from 15 to 35 weight-percent ethylenically unsaturated photo-monomer (where at least 2% by weight of the photo-monomer is an amine acrylate, a methacrylate having amine functionality, or a combination of the two);
  (iii) from 1 to 10 weight percent photo-initiator; and
  (iv) from 0.1 to 1.0 weight percent visible light sensitizer.

In an alternative embodiment, (i.e. in addition to the cover layer) the adhesive layer: i. can also comprise any or all of the above-mentioned additives; and ii. can have a weight average molecular weight greater than 50,000.

When cured to form a two-layer polyimide-based composition, the materials of the present invention generally comprise a low-CTE cover layer and a high-CTE adhesive layer. Ultimately, the adhesive layer will comprise a low-Tg polyimide base polymer, and the cover layer comprises a high-Tg polyimide base polymer. A base polymer will be from 50 weight percent up to about 95, 96, 97, 98, 99, 99.5 or 100 weight percent of the entire polymeric (and non-polymeric) composition.

The low-Tg polyimide of the adhesive layer is typically a polyimide having a glass transition temperature (Tg) between and including any of the following: 170, 180, 190, 200, 210, 220, 230, 240 and 250° C.

In one embodiment, the cover layer ultimately comprises a polyimide having an in-plane CTE between any two of the following numbers: 25, 22, 20, 18, 16, 14, 12, 10, 8, 5 and 3 ppm/° C. measured at 30° C. Conversely, the adhesive layer's polyimide component typically has a CTE of between 50, 60, 70, 80, 90, 100, 110, 120, 130, 140 and 150 ppm/° C. at 30° C. (as is the nature of polyimide adhesives generally). It is generally useful herein for the ratio of the cover layer thickness and the adhesive layer thickness to be controlled so that the two-layer polyimide-based composite formed therefrom has an overall CTE of between any two of the following numbers 10 12, 14, 16, 18, 20, 25, 30, 35 and 40 ppm/° C. at 30° C. In another embodiment of the present invention, the two-layer polyimide-based composites have a total CTE (or combined CTE) that differs by no more than 15, 13, 11, 9, 7, 5, 3 or 1 ppm/° C. (at 30° C.) from an electronic substrate upon which the coverlay is to be applied.

A base substrate, as used herein, can mean: i. any polymer substrate (including a polyimide) substrate; ii. any polymer (including a polyimide) substrate bonded to a metal; or iii. a polymer or polyimide substrate having thereon flexible circuit traces. Controlling the CTE of the two-layer polyimide based composite with respect to the base substrate, in the range mentioned above, can result in little to no unwanted curl when the two-layer structure is used as a circuit coverlay composition.

In another embodiment of the present invention, the thickness of the cover layer after curing (i.e. the high-modulus layer) can be between and including any two of the following numbers 10, 20, 30, 40, 50, 60, 70, and 75 microns. Typically, the thickness of the adhesive layer after curing can be between 1, 2, 5, 8, 10, 12, 15, 18, and 20 microns.

Organic Solvents

Useful organic solvents for the synthesis of the polyimide-based compositions (derived from polyamic acid-based compositions) of the present invention are also capable of dissolving the polyamic acid precursor materials as well as some (or all) of the other components. Such a solvent should also have a relatively low boiling point (e.g., below 225° C.) so that the polyimide-based composition can be dried at moderate (i.e., more convenient and less costly) temperature. A boiling point of less than 210, 205, 200, 195, 190, or 180° C. is preferred.

Polar aprotic solvents are particularly useful in forming polyimides. Hence, the composite additives of the present invention are preferably designed to readily disperse in polar aprotic solvents, such as, N-methylpyrrolidinone (NMP), dimethylacetamide (DMAc), gamma-butyrolactone, N,N'-dimethyl-formamide (DMF), dimethyl sulfoxide (DMSO), and tetramethyl urea (TMU). In one embodiment of the present invention, the preferred solvent is dimethylacetamide (DMAc).

Co-solvents can also be used generally at about five to 50 weight percent of the total solvent. Useful co-solvents include diethyleneglycol diethyl ether, 1,2-dimethoxyethane (monoglyme), diethylene glycol dimethyl ether (diglyme), 1,2-bis-(2-methoxyethoxy)ethane(triglyme), bis [2-(2-methoxyethoxy)ethyl)]ether(tetraglyme), bis-(2-methoxyethyl) ether, tetrahydrofuran, propylene glycol methyl ether, propylene glycol methyl ether acetate, "Cellosolve™" (ethylene glycol ethyl ether), butyl "Cellosolve™" (ethylene glycol butyl ether), "Cellosolve™ acetate" (ethylene glycol ethyl ether acetate), and "butyl Cellosolve™ acetate" (ethylene glycol butyl ether acetate).

Photosensitive Polyamic Acid-Based Compositions

The photosensitive polyamic acid-based compositions of the present invention comprise (i) a polyamic acid, (ii) an ethylenically unsaturated photo-monomer, (iii) a photo-initiator, and (iv) a visible light sensitizer. In one embodiment of the present invention, the cover layer of a two-layer polyamic acid composite can be a photosensitive polyamic acid-based composition. These compositions are mainly derived from mixing a polyamic acid with an ethylenically unsaturated photo-monomer, a photo-initiator, and a visible light sensitizer. These components are typically added to an already prepared solution of polyamic acid in an organic solvent. The mixture can form a developable polyamic-based composition that is developable in aqueous sodium carbonate. When cured under heat, the polyamic acid portion of the mixture can then form a polyimide via a condensation reaction.

The polyamic acid-based composition of the adhesive layer (the adhesive layer) can optionally comprise an ethylenically unsaturated photo-monomer, a photo-initiator, and a visible light sensitizer. While it is not necessary in many cases for the adhesive layer to be photosensitive, the adhesive layer can have these components, and thus these properties, if desired.

The photosensitive polyamic acid-based compositions comprise about 60 to 85 weight-percent (on a dry solids basis) polyamic acid polymer. A variety of polyamic acids can form polyamic acid-based compositions of the present invention. Useful low Tg polyimides are derived polyamic acids comprising diamines having two or more ether moieties positioned between unsubstituted, or substituted, aromatic groups. Other polyamic acids used to form low Tg polyimide are derived from polyamic acids comprising diamines having siloxane moieties positioned between either unsubstituted, or substituted, aromatic groups. For the low-Tg polyimide base polymer, useful aliphatic diamines, having the following structural formula: $H_2N-R-NH_2$, where R is an aliphatic moiety, such as a substituted or unsubstituted hydrocarbon in a range from 4, 5, 6, 7 or 8 carbons to about 9, 10, 11, 12, 13, 14, 15, or 16 carbon atoms (or the aliphatic moiety is a $C_6$ to $C_8$ aliphatic) can also be used. In one embodiment, R is a $C_6$ straight chain hydrocarbon, known as hexamethylene diamine (HMD or 1,6-hexanediamine). Depending upon the particular embodiment of the present invention, other suitable aliphatic diamines include, 1,4-tetramethylenediamine, 1,5-pentamethylenediamine (PMD), 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), 1,16-hexadecamethylenediamine. The preferred aliphatic diamine is hexamethylene diamine (HMD). In yet other embodiments, the aliphatic diamine is an alpha, omega-diamine; such diamines can be more reactive than alpha, beta-aliphatic diamines. Generally, to achieve good adhesion to a flexible substrate, the mole % loading of an aliphatic diamine (based upon the total diamine) can be in a range of about 50, 55, 60, 65, or 70 to about 75, 80, 85 or 90 mole %. In this embodiment, if less than 50 mole % of the total diamine component is aliphatic diamine, the resulting polyimide formed therefrom can have too high a glass transition temperature ("$T_g$") to be considered a good polyimide adhesive. If more than 90 mole % of the total diamine component is an aliphatic diamine, then the resulting polyimide can have insufficient thermal stability use in many flexible circuit material applications.

In one embodiment of the present invention, good bonding of the coverlay to a metal circuit trace can require a lamination temperature that can be about 25° C. higher than the glass transition temperature of the adhesive layer polyimide. Reduced adhesion strength (i.e. too low adhesivity or too low bond values) can be observed if the Tg of the adhesive polyimide is above 250° C. If the glass transition temperature of the polyimide in the adhesive layer is in the range of about 170° C. to 250° C., the coverlay can typically bond well to a base substrate using low-temperature bonding conditions.

Suitable aromatic diamines include, m-phenylenediamine, p-phenylenediamine, 2,5-dimethyl-1,4-diaminobenzene, trifluoromethyl-2,4-diaminobenzene, trifluoromethyl-3,5-diaminobenzene, 2,5-dimethyl-1,4-phenylenediamine (DPX), 2,2-bis-(4-aminophenyl)propane, 4,4'-diaminobiphenyl, 4,4'-diaminobenzophenone, 4,4'-diaminodiphenylmethane, 4,4'-diaminodiphenyl sulfide, 4,4'-diaminodiphenyl sulfone, 3,3'-diaminodiphenyl sulfone, bis-(4-(4-aminophenoxy)phenyl sulfone (BAPS), 4,4'-bis-(aminophenoxy)biphenyl (BAPB), 4,4'-diaminodiphenyl ether, 3,4'-diaminodiphenyl ether, 4,4'-diaminobenzophenone, 4,4'-isopropylidenedianiline, 2,2'-bis-(3-aminophenyl)propane, N,N-bis-(4-aminophenyl)-n-butylamine, N,N-bis-(4-aminophenyl)methylamine, 1,5-diaminonaphthalene, 3,3'-dimethyl-4,4'-diaminobiphenyl, m-amino benzoyl-p-amino anilide, 4-aminophenyl-3-aminobenzoate, N,N-bis-(4-aminophenyl) aniline, 2,4-diaminotoluene, 2,5-diaminotoluene, 2,6-diaminotoluene, 2,4-diamine-5-chlorotoluene, 2,4-diamine-6-chlorotoluene, 2,4-bis-(beta-amino-t-butyl)toluene, bis-(p-beta-amino-t-butyl phenyl)ether, p-bis-2-(2-methyl-4-aminopentyl)benzene, m-xylylene diamine, and p-xylylene diamine.

Other useful aromatic diamines include, 1,2-bis-(4-aminophenoxy)benzene, 1,3-bis-(4-aminophenoxy)benzene, 1,2-bis-(3-aminophenoxy)benzene, 1,3-bis-(3-aminophenoxy)benzene, 1-(4-aminophenoxy)-3-(3-aminophenoxy)benzene, 1,4-bis-(4-aminophenoxy)benzene, 1,4-bis-(3-aminophenoxy)benzene, 1-(4-aminophenoxy)-4-(3-aminophenoxy)benzene, 2,2-bis-(4-[4-aminophenoxy]phenyl)propane (BAPP), 2,2'-bis-(4-aminophenyl)-hexafluoro propane (6F diamine), 2,2'-bis-(4-phenoxy aniline)isopropylidene, 2,4,6-trimethyl-1,3-diaminobenzene, 4,4'-diamino-2,2'-trifluoromethyl diphenyloxide, 3,3'-diamino-5,5'-trifluoromethyl diphenyloxide, 4,4'-trifluoromethyl-2,2'-diaminobiphenyl, 2,4,6-trimethyl-1,3-diaminobenzene, 4,4'-oxy-bis-[2-trifluoromethyl)benzene amine](1,2,4-OBABTF), 4,4'-oxy-bis-[3-trifluoromethyl)benzene amine], 4,4'-thio-bis-[(2-trifluoromethyl)benzene-amine], 4,4'-thiobis[(3-trifluoromethyl)benzene amine], 4,4'-sulfoxyl-bis-[(2-trifluoromethyl)benzene amine, 4,4'-sulfoxyl-bis-[(3-trifluoromethyl)benzene amine], and 4,4'-keto-bis-[(2-trifluoromethyl)benzene amine].

In one embodiment of the present invention, useful aromatic diamines include the isomers of bis-aminophenoxybenzenes (APB), aminophenoxyphenylpropane (BAPP), dimethylphenylenediamine (DPX), bisaniline P, and combinations thereof. The use of these particular aromatic diamines can lower the lamination temperature of the polyimide (i.e. the Tg), and can increase the peel strength of the polyimide to other materials like metal.

In another embodiment of the present invention, the polyimide-based adhesive composition may be derived from a polyamic acid derived from the reaction of a dianhydride with a polysiloxane diamine. Typically, polysiloxane diamines are used in conjunction with non-polysiloxane containing diamines. Usually the ratio between the two is about 15 to 60 mole-percent polysiloxane diamine per the total diamine component. This amount of polysiloxane diamine can produce a polyimide having a glass transition temperature between 170° C. and 250° C. For example, polysiloxane diamines useful in the present invention have the general formula:

where R' and R" are —(CH₃) or (C₆H₅), and where $R_1$ is —(CH₂)—$_n$ where n=1 to 10, or where n=3, and m is 1 to 200, but is can be 1 to 12 and can be 8-10. (Siloxane diamines are herein denoted by the notation "$G_m$", where "m" is the number of "repeat" siloxane functional groups).

For example one useful polysiloxane diamine is poly(dimethylsiloxane), bis(3-aminopropyl) terminated (herein referred to as a "polysiloxane diamine"). Polysiloxane diamine can have the structure of the formula below,

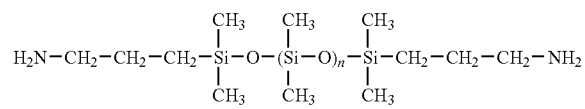

where n is equal to from 1 to 40, or from 5 to 20, or can be from 9 to 10.

In one embodiment of the present invention, the amount of polysiloxane diamine useful within in the total diamine component of the polyimide-base adhesive composition ranges from 15 to 60 mole-percent (as a percentage of the total diamine component). In another embodiment of the present invention, the polyimidosiloxane of the polyimide-based adhesive can comprises between 20 and 45 mole-percent polysiloxane diamine, and in yet another embodiment, from 30 to 35 mole-percent polysiloxane diamine is most preferred.

In another embodiment, the polyimide-based adhesive composition of the adhesive layer can comprise a copolyimide adhesive contains at least 60 mole %, or at least from 40 to 80 mole %, or at least from 70 to 80 mole % of imide units derived from 4,4'-oxydiphthalic dianhydride (ODPA) and an aromatic ether diamine derived from resorcinol oxydianiline (RODA). If the percentage of such imide units (i.e. ODPA-RODA imide units) is lower than 60 mole %, it is difficult to obtain a copolyimide adhesive having a glass transition temperature less than 250° C. (RODA diamine, see FIG. 1 below).

FIG. 1

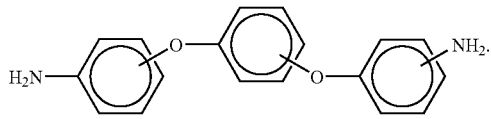

Some representative aromatic ether diamines (i.e. "RODA" diamines) include but are not limited to the following:

(i) 1,2-bis(4-aminophenoxy)benzene;
(ii) 1,3-bis(4-aminophenoxy)benzene;
(iii) 1,2-bis(3-aminophenoxy)benzene;
(iv) 1,3-bis(3-aminophenoxy)benzene;
(v) 1-(4-aminophenoxy)-3-(3-aminophenoxy)benzene;
(vi) 1,4-bis(4-aminophenoxy)benzene;
(vii) 1,4-bis(3-aminophenoxy)benzene; and
(viii) 1-(4-aminophenoxy)-4-(3-aminophenoxy)benzene.

In one embodiment of the present invention, any aromatic dianhydride, or combination of aromatic dianhydrides, can be used as a suitable dianhydride monomer with respect to forming the high-Tg polyimide. With respect to the low-Tg polyimide (the adhesive layer), polyamic acids that are soluble in aqueous base are generally preferred. If the polyamic acids of the adhesive layer are not aqueous developable, the two-layer composites will not exhibit 'total wash through' properties.

The dianhydrides may be used alone or in combination with one another. These dianhydrides can be used in their tetra-acid form (or as mono, di, tri, or tetra esters of the tetra acid), or as their diester acid halides (chlorides). However in some embodiments, the dianhydride form of the monomer can be preferred, because it is generally more reactive than the acid or the ester form.

Examples of suitable aromatic dianhydrides include: 1,2,5,6-naphthalene tetracarboxylic dianhydride, 1,4,5,8-naphthalene tetracarboxylic dianhydride, 2,3,6,7-naphthalene tetracarboxylic dianhydride, 2-(3',4'-dicarboxyphenyl) 5,6-dicarboxybenzimidazole dianhydride, 2-(3',4'-dicarboxyphenyl) 5,6-dicarboxybenzoxazole dianhydride, 2-(3',4'-dicarboxyphenyl) 5,6-dicarboxybenzothiazole dianhydride, 2,2',3,3'-benzophenone tetracarboxylic dianhydride, 2,3,3',4'-benzophenone tetracarboxylic dianhydride, 3,3',4,4'-benzophenone tetracarboxylic dianhydride (BTDA), 2,2', 3,3'-biphenyl tetracarboxylic dianhydride, 2,3,3',4'-biphenyl tetracarboxylic dianhydride, 3,3',4,4'-biphenyl tetracarboxylic dianhydride (BPDA), bicyclo-[2,2,2]-octen-(7)-2,3,5,6-tetracarboxylic-2,3,5,6-dianhydride, 4,4'-thio-diphthalic anhydride, bis(3,4-dicarboxyphenyl)sulfone dianhydride, bis (3,4-dicarboxyphenyl)sulfoxide dianhydride (DSDA), bis(3,4-dicarboxyphenyl oxadiazole-1,3,4) p-phenylene dianhydride, bis(3,4-dicarboxyphenyl)-2,5-oxadiazole 1,3,4-dianhydride, bis 2,5-(3',4'-dicarboxydiphenylether) 1,3,4-oxadiazole dianhydride, 4,4'-oxydiphthalic anhydride (ODPA), bis(3,4-dicarboxyphenyl)thio ether dianhydride, bisphenol A dianhydride (BPADA), bisphenol S dianhydride, 2,2-bis-(3,4-dicarboxyphenyl) 1,1,1,3,3,3,-hexafluoropropane dianhydride (6FDA), 5,5-[2,2,2]-trifluoro-1-(trifluoromethyl)ethylidene, bis-1,3-isobenzofurandione, 1,4-bis(4,4'-oxyphthalic anhydride)benzene, bis(3,4-dicarboxyphenyl)methane dianhydride, cyclopentadienyl tetracarboxylic acid dianhydride, cyclopentane tetracarboxylic dianhydride, ethylene tetracarboxylic acid dianhydride, perylene 3,4,9,10-tetracarboxylic dianhydride, pyromellitic dianhydride (PMDA), tetrahydrofuran tetracarboxylic dianhydride, 1,3-bis-(4,4'-oxydiphthalic anhydride)benzene, 2,2-bis(3,4-dicarboxyphenyl)propane dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, benzene-1,2,3,4-tetracarboxylic dianhydride; and thiophene-2,3,4,5-tetracarboxylic dianhydride.

The polyamic acid used to prepare the low-CTE polyimide of the cover layer can typically have a weight-average molecular weight of 100,000 or less, and sometimes less than 50,000, based on molecular weight determinations by gel permeation chromatography. Compositions having a polyimide with a weight average molecular weight greater than 50,000 may not develop readily in aqueous carbonate solution. Therefore, low CTE polyimides of the present invention (i.e. those used in the cover layer) typically have a weight-average molecular weight of less than 50,000 and are easy to develop. In one embodiment, the low-CTE layer comprised a polyimide having a weight-average molecular weight of about 90,000, and was indeed developable.

Polyamic acid used to produce the low-CTE polyimide-base compositions (the cover layer) of the present invention can be derived from the reaction product of components comprising a 'dianhydride component' and a 'diamine component'. The dianhydride component can be about 85 to 99 mole % of a dianhydride selected from the group consisting of biphenyltetracarboxylic dianhydride (BPDA), pyromellitic dianhydride (PMDA) or mixtures of BPDA and PMDA. The diamine component can be 95 to 100 mole % of a diamine selected from the group consisting of PPD, or mixtures of PPD with diaminobenzanilide (or substituted diaminobenzanilides such as 2-methoxy-4,4'-diaminobenzanilide, 2'-methoxy-4,4'-diaminobenzanilide or 2,2'-dimethoxy-4,4'-diamino-benzanilide). After curing, to form a low-CTE polyimide-based composition, the composition can have a CTE of between 30 and 5 ppm/° C. (or about 10 ppm/° C.) measured at 30° C.

In one embodiment of the present invention, chain extender chemistry (which is based on adding to an existing polyamic acid that has excess diamine, a tetracarboxylic acid at a level of about 1 to 15 mole %) can be used. The amount of tetracarboxylic acid added is based on the amount of corresponding dianhydride needed to react with the unreacted diamine ends. This way of forming a polyamic acid is useful to synthesize low molecular weight polymers (polymers having a weight average molecular weight of less than about 100,000 or 50,000).

During curing of a low-CTE polyimide, particularly a composition using the 'chain extender' chemistry described above, a carboxylic acid-amine salt converts (with loss of water) to a dianhydride forming a polyamic acid chain having "free" amine ends. During curing of the polyimide (the heating stage typically after development) the amine ends can then react quickly with the dianhydride present to form longer polyamic acid chains. This can allow shorter polyamic acid chains to combine with one another to form higher molecular weight chains thus producing a good low-CTE (i.e. high molecular weight) polyimide.

Some tetracarboxylic acids useful as 'chain extenders' are derived from the reaction product of water with common aromatic dianhydrides such as pyromellitic dianhydride (PMDA), and biphenyl tetracarboxylic dianhydride (BPDA). In one embodiment of the present invention, a low-CTE polyimide-based composition is derived in part from a low-CTE copolyimide. The low-CTE copolyimide is derived from an aromatic copolyamic acid prepared by copolymerizing substantially equimolar amounts of (i) aromatic tetracarboxylic acid component comprising, based on the total amount of the tetracarboxylic acid component 10 to 90 mole % (or about 30 to 50 mole %) of a biphenyltetracarboxylic acid or a functional derivative thereof and 90 to 10 mole %, or about 50 to 70 mole %, of a pyromellitic acid or a functional derivative thereof, and (ii) an aromatic diamine component comprising, based on the total amount of the aromatic diamine component, 10 to 90 mole %, or about 60 to 80 mole %, of p-phenylenediamine, and 90 to 10 mole %, or about 20 to 40 mole %, of 4,4'-diaminodiphenyl ether (DADE), or a diaminobenzanilide (or substituted diaminobenzanilides such as 2-methoxy-4,4'-diaminobenzanilide, 2'-methoxy-4, 4'-diaminobenzanilide or 2,2'-dimethoxy-4,4'-diaminobenzanilide).

In the above, if the amount of biphenyltetracarboxylic acid used is too low at a given diamine ratio, the resultant copolyimide may have an increased thermal expansion coefficient (CTE) as well as an unwanted high hygroscopic expansion coefficient (CHE). With respect to the aromatic diamine component of the above embodiment, if the amount of the p-phenylenediamine used is too low, at a constant dianhydride ratio, the resultant copolyimide may have an unwanted high thermal expansion coefficient or may have a low modulus of elasticity. This could result in low stiffness and/or poor heat resistance. Finally, if the amount of p-phenylenediamine component is too high, at a constant dianhydride ratio, the modulus of the material may increase, resulting in a copolyimide having poor flexibility.

Examples of a biphenyltetracarboxylic acid and its functional derivatives useful in the present invention include 3,3', 4,4'-biphenyltetracarboxylic acid and its dianhydride (BPDA), and lower alcohol esters of the acids. Preferred examples of pyromellitic acid and its functional derivatives, include pyromellitic acid and its dianhydride (PMDA), and lower alcohol esters thereof.

Ethylenically Unsaturated Photo-Monomer

In the embodiments of the present invention, about 15 to 35, by dry weight-percent, of photo-monomer is used in the photosensitive polyamic acid-based compositions. The photo-monomer component allows these compositions to be 'photoimageable' coatings. The photo-monomer component should contain a sufficient fraction of ethylenically unsaturated groups which make the composition capable of undergoing polymerization. Upon exposure to actinic radiation, for example, the photo-initiator system can induce chain-propagated polymerization of the monomeric materials by a condensation mechanism, or by a free radical addition polymerization reaction.

While many photopolymerizable mechanisms can be contemplated, the compositions and processes of the present invention can be described in the context of free radical initiation addition polymerization of monomers having one or more terminal ethylenically unsaturated groups. In this context, the photo-initiator system, when exposed to actinic radiation, acts as a source of free radicals. These free radicals are then needed to initiate polymerization of the monomers.

The photo-initiator of the system is typically activated by a photo-sensitizer that absorbs actinic radiation. The absorption frequency of the photo-initiator can be outside the absorption spectrum of the initiator itself in order to sensitize the addition polymerization in more practical radiation spectral region (such as near ultraviolet, near visible light and/or near infrared). In a narrow sense, the term "photo active component" as used herein refers to a material that absorbs actinic radiation. Examples of 'photo active components' are photo-initiators and/or photo-sensitizers. In the broader sense however, the term "photo active component" refers to any and all the essential materials needed for photopolymerization to occur (i.e. the photo initiating system and/or the monomer).

To achieve photopolymerization, the present invention employs the use of diacrylates, or dimethacrylates, with two ethylenically unsaturated groups per molecule. Lesser amounts of trifunctional acrylate or methacrylate photo-monomers can also be used effectively, but excessive amounts of any 'acrylate specie' can result in reduction in flexibility of the two layer polyimide-based composition.

Suitable photo-monomers that can be used as the sole photo-monomer, or at a level of at least two-percent by dry weight of the photo-monomer component (or in combination with other photo-monomers) are amine acrylates and methacrylate. Examples include, but are not limited to:

(i) N-methyldiethylamino dimethacrylate (MADEMA), (ii) dimethylaminopropyl methacrylamide (BM611), (iii) dimethylamino dimethacrylate, and (iv) acrylated amine oligomer acrylate (Ebecryl® 7100).

As long as at least two weight percent of amine acrylate, or methacrylate, is used in the photo-monomer component additional non-amine containing photo-monomers can also be used. Examples of useful non-amine containing photo-monomers include, but are not limited to:

(i) hexamethylene glycol diacrylate,
    (ii) triethylene glycol diacrylate,
    (iii) polyethylene glycol (200) diacrylate,
    (iv) cyclohexane dimethanol diacrylate,
    (v) oxyethylated phenol acrylate,
    (vi) tripropylene glycol diacrylate,
    (vii) trimethylolpropane triacrylate,
    (viii) polyoxyethylated trimethylolpropane triacrylate,
    (ix) poly-oxypropylated trimethylolpropane triacrylate,
    (x) pentaerythritol triacrylate, and
    (xi) pentaerythritol tetraacrylate.

Photo-Initiator System

In the embodiments of the present invention, the photosensitive polyamic acid-based compositions employ about 1 to 10 by dry weight-percent of a photo-initiator system. Generally, the photo-initiator system is used to allow a sufficient amount of incident exposure radiation to penetrate through the cover layer, or optionally both layers so that a sufficient amount photopolymerization can occur.

The photo-initiator system can have one or more compounds that directly furnishes free-radicals when activated by actinic radiation. The photo-initiator system can also contain a light sensitizer that can be activated by actinic radiation thus causing the compound to furnish at least some free-radical species.

The photo-initiator systems of the present invention typically contain a photo-sensitizer that can extend a spectral response into the near ultraviolet, visible, and near infrared spectral regions. A large number of free-radical generating compounds, including redox systems such as Rose Bengal/2-dibutylaminethanol, may be selected. Photo-reducible dyes and reducing agents such as those disclosed in U.S. Pat. Nos. 2,850,445; 2,875,047; 3,097,096; 3,074,974; 3,097,097; 3,145,104; and 3,579,339; as well as dyes of the phenazine, oxazine, and quinone classes; ketones, quinones; 2,4,5-triphenylimidazolyl dimers with hydrogen donors, and mixtures thereof as described in U.S. Pat. Nos. 3,427,161; 3,479,185; 3,549,367; 4,311,783; 4,622,286; and 3,784,557 can be used as initiators. Other initiators are dye-borate complexes disclosed in U.S. Pat. No. 4,772,541; and trichloromethyl triazines disclosed in U.S. Pat. Nos. 4,772,534 and 4,774,163. A useful discussion of dye sensitized photopolymerization can be found in "Dye Sensitized Photopolymerization" by D. F. Eaton in Adv. in Photochemistry, Vol. 13, D. H. Volman, G. S. Hammond, and K. Gollinick, eds., Wiley-Interscience, New York, 1986, pp. 427-487. Similarly, the cyclohexadienone compounds of U.S. Pat. No. 4,341,860 are useful as initiators.

Useful photo-initiators in the present invention are benzophenone, Michler's ketone, ethyl Michler's ketone, p-dialkylaminobenzoate alkyl esters, thioxanthones, hexaarylbiimidazoles, benzoin dialkyl ethers, 2-methyl-1-[4-(methylthio)phenyl]-2-(4-morpholinyl)-1-propanone, or combinations thereof. Other useful photo-initiators include CDM-HABI, i.e., 2-(o-chlorophenyl)-4,5-bis(m-methoxyphenyl)-imidazole dimer; o-Cl—HABI, i.e., 1,1'-biimidazole, 2,2'-bis(o-chlorophenyl)-4,4',5,5'-tetraphenyl; and TCTM-HABI, i.e., 1H-imidazole, 2,5-bis(o-chlorophenyl)-4-[3,4-dimethoxyphenyl]dimer, each of which is typically used with a hydrogen donor.

Visible Light Sensitizers

The photosensitive polyamic acid-based compositions of the present invention employ the use of visible light sensitizers in an amount of about 0.1 to 1.0, by dry weight precent. These light sensitizers are used to enhance the absorption of UV light energy. Photo-sensitizers useful in combination with photo-initiators are isopropylthioxanthone, coumarins such as 2,3,6,7-tetrahydro-1,1,7,7-tetramethyl-11-oxo-1H,5H,11H-(1)benzopyrano[5,7,8-ij]quinolizine-10-carboxylic acid ethyl ester, bis(p-dialkylaminobenzylidene)ketones disclosed in Baum et al, U.S. Pat. No. 3,652,275, the arylidene aryl ketones disclosed in Dueber, U.S. Pat. No. 4,162,162, and the N-alkylindolylidene and N-alkylbenzo-thiazolylidene alkanones disclosed in Dueber et al, U.S. Pat. No. 4,454,218. Other sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769.

A useful discussion of dye sensitized photopolymerization can be found in "Dye Sensitized Photopolymerization" by D. F. Eaton in Adv. in Photochemistry, Vol. 13, D. H. Volman, G. S. Hammond, and K. Gollinick, eds., Wiley-Interscience, New York, 1986, pp. 427-487. One useful group of sensitizers includes the bis(p-dialkylaminobenzylidene)ketones disclosed in U.S. Pat. No. 3,652,275 to Baum et al., and the arylyidene aryl ketones disclosed in U.S. Pat. No. 4,162,162 to Dueber. Other useful sensitizers include the following: DBC, i.e., cyclopentanone; 2,5-bis-{[4-(diethylamino)-2-methylphenyl]-methylene}; DEAW, i.e., cyclopentanone, 2,5-bis{[4-(diethylamino)-phenyl]methylene}; dimethoxy-JDI, i.e., inden-I-one, 2,3-dihydro-5,6-dimethoxy-2-[(2,3,6,7-tetrahydro-IH,5H-benzo[i,j]-quinolizin-9-yl)methylene); and JAW, i.e., cyclopentanone, 2,5-bis[(2,3,6,7-tetrahydro-IH,5H-benzo[i,j]quinolizin-I-yl)methylene]. Yet other useful sensitizers are cyclopentanone, 2,5-bis[2-(1,3-dihydro-1,3,3-trimethyl-2H-indol-2-ylidene)ethylidene], CAS 27713-85-5; and cyclopentanone, 2,5-bis[2-(I-ethylnaphtho[1,2-d]thiazol-2(IH)-ylidene)ethylidene], CAS 27714-25-6. Hydrogen donor compounds that function as chain transfer agents in the photopolymer compositions include: 2-mercaptobenzoxazole, 2-mercaptobenzothiazole, 4-methyl-4H-1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of U.S. Pat. No. 3,390,996 to MacLachlan. Suitable hydrogen donor compounds for use in systems containing both biimidazole type initiator and N-vinyl carbazole are 5-chloro-2-mercaptobenzothiazole; 2-mercaptobenzothiazole; 1H-I,2,4-triazole-3-thiol; 6-ethoxy-2-mercaptobenzothiazole; 4-methyl-4H-1,2,4-triazole-3-thiol; 1-dodecanethiol; and mixtures thereof.

Finally, additional materials may also be employed as sensitizers, these materials include benzophenone, Michler's ketone, ethyl Michler's ketone, p-dialkylaminobenzaldehydes, p-dialkylaminobenzoate alkyl esters, polynuclear quinones, thioxanthones, hexaarylbiimidazoles, cyclohexadienones, benzoin, benzoin dialkyl ethers, or combinations thereof wherein the alkyl group contains 1 to 4 carbon atoms.

Adhesion Promotors

The photoimageable polyamic acid-based compositions of the present invention (typically the adhesive layer) may also optionally contain a heterocyclic or mercaptan compound to improve adhesion of the coating to a metal circuit pattern. Suitable adhesion promoters include heterocyclics such as those disclosed in U.S. Pat. No. 3,622,334 to Hurley et al., U.S. Pat. No. 3,645,772 to Jones, and U.S. Pat. No. 4,710,262 to Weed.

Examples of other useful adhesion promoters include benzotriazole, 5-chloro-benzotriazole, 1-chloro-benzotriazole, 1-carboxy-benzotriazole, 1-hydroxy-benzotriazole, 1,2- napthotriazole, benzimidazole, mercaptobenzimidazole, 5-nitro-2-mercaptobenimidazole, 5-amino-2-mercyptobenzimidazole, 2-amino-benzimidazole, 5-methyl-benzimidazole, 4,5-diphenyl-benzimidazole, 2-guanadino-benzimidazole, benzothiazole, 2-amino-6-methyl-benzothiazole, 2-mercaptobenzothiazole, 2-methyl-benzothiazole, benzoxazole, 2-mercaptobenzoxazole, 2-mercaptothiazoline, benzotriazole, 3-amino-1,2,4-triazole, 1H-1,2,4-triazole-3-thiol, 5-amino-1,3,4-thiodiazole-2-thiol, 4-mercapto-IH-pyrazolo[3,4-d]pyrimidine, 4-hydroxy-pyrazolo[3,4-d]pyrimidene, 5-amino-tetrazole monohydrate, tolutriazole, 1-phenyl-3-mercapototetrazole, 2-amino-thiazole, and thio-benzanilide.

Yet other useful adhesion promoters include 2-amino-5-mercaptothiophene, 5-amino-1,3,4-thiodiazole-2-thiol, benzotriazole, 5-chloro-benzotriazole, 1-chloro-benzotriazole, 1-carboxy-benzotriazole, 1-hydroxy-benzotriazole, 2-mercaptobenzoxazole, 1H-1,2,4-triazole-3-thiol, and mercaptobenzimidazole.

Generally the adhesion promoters of the present invention can comprise,
 a. a thiophene having an —H or —SH on the 2 position carbon (on one side of the sulfur) and an —NH$_2$ on the 5 position carbon (on the other side of the sulfur); and
 b. a nitrogen substituted thiophene ring, wherein nitrogen is substituted at the thiophene ring:
  i. 3 position;
  ii. 4 position; or
  iii. both the 3 position and the 4 position and
  wherein —H or —SH is on the 2 position carbon and an —NH$_2$ is on the 5 position carbon.

Other Useful Components

Other useful compounds optionally added to the photosensitive polyamic acid-compositions of the present invention can be used to modify the physical properties of the final composite. Such components include: thermal stabilizers, colorants such as dyes and pigments, coating aids, wetting agents, release agents, and the like.

Thermal polymerization inhibitors that can be used in the permanent coating compositions are: Irganox® 1010, p-methoxyphenol, hydroquinone, and alkyl and aryl-substituted hydroquinones and quinones, tert-butyl catechol, pyrogallol, beta-naphthol, 2,6-di-tert-butyl-p-cresol and the like. Also useful as thermal polymerization inhibitors are the nitroso compounds disclosed in U.S. Pat. No. 4,168,982. In addition, various dyes and pigments may be added to increase the visibility of the resist image. Any colorant used, however, can be transparent to the actinic radiation used.

Development of the Photosensitive Polyamic Acid-Based Compositions Using Light Energy The photosensitive polyamic acid-based compositions of the present invention typically contain 60 to 85 weight percent dry solids. The adhesive layer polyamic acid-base compositions (the bonding layer) typically have a relatively high molecular weight of between 200,000 and 300,000. The cover layer polyamic acid-based compositions (the cover layer) typically have a relatively low molecular weight typically between 10,000 and 50,000. These compositions are generally developable in a temperature range between and including any two of the following numbers 20, 22, 24, 26, 28, 30, 32, 34, 36, 38, 40, 42, 44, 46, 48 and 50° C.

Developer solutions of the present invention typically employ an aqueous alkali solution such as sodium or potassium carbonate solution. Other developer solutions useful in the present invention include tetramethylammonium hydroxide solution containing one-percent aqueous sodium or potassium carbonate.

The thicknesses of the different layers of the two-layer composites can be tailored to form a flexible laminate substrate (circuit substrates) having little to no CTE mismatch with a base substrate. In general, the adhesive layer of a two-layer or multi-layer composite is used to provide adhesion to the substrate. This layer is typically thinner than the cover layer since it typically has a relatively high CTE, as layers sufficient for good adhesion usually do. As such, the thickness of the upper layer is relatively thicker than the lower layer and is used to adjust the composite's CTE to match that of a flexible printed circuit.

Polyamic acids derived from diamine components containing a significant amount of p-phenylene diamine typically show a reduction in photo-speed. This is thought to be due to the "quinoidyl" form of PPD being present in the PPD raw material. This form of PPD can be effective inhibitor (an unwanted inhibitor) of photopolymerization. This form of PPD is believed to be the result of air oxidation of PPD in general prior to the preparation of a polyamic acid. Improvements in photo-speed were discovered when a polyamic acid solution is reacted with sodium sulfite, potassium sulfite, sodium hydrogen sulfite, or potassium hydrogen sulfite. After stirring the polymer mixture at room temperature for several hours, excess or unwanted solids material can be filtered from the polymer mixture.

Improvements in photo-speed can also be possible by pre-reacting the polyamic acid with a low temperature Vazo® thermal initiator, by reacting with a primary amine such as ethanol-amine, or by reacting with a thioglycolic acid or mercaptoacetic acid. Surprisingly, it was discovered that at least a 2× improvement in photo-speed is generally obtained with effective quenching of the inhibitor. This quenching can allow a composition to have an acceptable exposure time during manufacture as well as an improved resistance of the photopolymer to attack by developer solution.

Other problems sometimes found during developing of a polyamic acid-based composition is the unwanted plasticizing, by a solvent (typically either NMP or DMAc. In some cases, a portion of the solvent can be extracted (i.e. generally not desirable) from the coating during aqueous carbonate development. This extraction can lead to unwanted curl of a flexible circuit sample after moisture then replaces the extracted high-boiling solvent. As such, unwanted curl can result, as well as general distortion (or warping) of a flexible circuit.

The exposed and developed compositions of the present invention can be cured under a time and temperature profile that also allows for a sufficient 'soak time' designed to eliminate unwanted volatile materials. This 'soak time' can be used to eliminate blistering of the material during downstream processing. For the cover layers of the present invention, a cure temperature of approximately 300° C. or greater is typically required for full imidization of the polyamic acid and removal of residual solvent. This temperature is typically sufficient to also cure the adhesive layer. For example, an effective curing profile is to ramp temperature by 5° to 7° C./min starting at 100° C. to about 250° C. Next, hold the temperature at 250° C. (to eliminate volatiles that are released below 250° C.) for about 20 to 40 minutes. After this hold time (or soak time), the temperature in the oven can then be ramped to a peak temperature of about 300° C. and held for at least 5 minutes. Curing performed at higher temperatures than 300° C. can sometimes degrade the composition such that there can be a reduction in the adhesivity of the coverlay to other substrates.

The Polyimide-Based Composition as Layers in a Flexible Circuit

In one embodiment of the present invention, the two layer polyimide-based compositions can be used as a good substitute (upgrade) for either an acrylic-based or epoxy-based coverlay composition. These compositions are commonly used as conformal coatings and/or encapsulates in the electronics industry.

The embodiments of the present invention can also be designed so that any number of laminate structures, useful in making different coverlay compositions useful in flexible electronic circuit applications, can be made. Advantageous properties associated with the polyimide films (i.e. the cured polyamic acid films) of the present invention include but are not limited to:

(1) a glass transition temperature (Tg) of the polyimide-based adhesive layer between (and including) any two of the following, 170, 175, 180, 185, 190, 195, 200, 205, 210, 215, 220, 225, 230, 235, 240, 245, and 250° C., (2) a coefficient of thermal expansion (CTE) of the low CTE polyimide-based layer between 30 and 5 ppm/° C., and (3) a coefficient of thermal expansion (CTE), of either a two-layer or multi-layer composite between 25 and 10 ppm/° C. at 30° C.

The polyamic acids described in the present invention when used as a cover layer can be aqueous carbonate development in their polyamic acid state and can provide for good adhesion after curing to flexible printed circuits. When used in a two-layer construction, the compositions of the present invention can be formulated so as not to curl.

'Curl' as defined herein is a result of differential dimensional change between the photoimageable coverlay and the polyimide substrate. The dimensional change is a result of thermal stress (the differences in CTE and modulus) between a coverlay and a base circuit substrate. Curl can be a major issue since unwanted curl can impede handling of a flexible circuit and can reduce yield in surface-mount applications. As such, a practitioner of the present invention can use these photosensitive polyamic acids to balance the overall CTE of a base substrate and coverlay. Generally, most base matrices have a CTE of 25 ppm/° C. or less. As such, if the photoimageable coverlay compositions of the present invention are made to provide a CTE between about 25 to 10 ppm/° C., flatness of the covered circuit can be achieved.

Multilayer Coating Process

Coating of the polyamic acid-based compositions of the present invention can be accomplished by coating the solutions directly onto a flexible circuit. Alternatively, a two-layer polyimide-based composition can be pre-coated by conventional means as a a liquid, or formed as a dry film which is later laminated to a flexible circuit. Different methods of coating these solutions include the use of a slot-die, dipping or kiss-roll coating, followed by metering with a doctor knife, doctor rolls, squeeze rolls or an air knife. The cover layer of the photosensitive permanent coating, as it appears after lamination to a flexible printed circuit, is the first layer-coated, from a solution of a coating composition, to a temporary support film and then dried. A second layer, which may be a adhesive layer of a two-layer coating can be applied as a solution to the dried surface of the first layer and then dried to obtain good adhesion between these two-layers and a tack-free surface. The process can be repeated if additional coating layers are used. Alternatively the different layers can be simultaneously coated using a multi-slot extrusion die coating method using a slot for each solution so that the layers can be coated at the same time utilizing one drying/curing step. Otherwise, each layer can be dried before the next layer is coated on top.

A cover film that is easily removed from a dried coating can be laminated to an exposed surface of the last coated layer. This is done in order to protect the coated composition. A tack-free surface (the adhesive layer) can generally have low adhesion to a circuit substrate under ambient conditions, but can develop good adhesion upon heat and pressure (e.g., such as during vacuum or roll lamination processing). One process, is to use a "pressure roll lamination process with NMP assist". This type of process aids encapsulation of the coating composition over circuit traces and also provides good adhesion. The tack free coatings mentioned above can contain a significant amount of high boiling solvent after drying depending on the solvent used. For NMP and DMAc, as much as 30% or more by weight of the tack-free coating is solvent may still be present. For this reason, where the "weight-percent dry solids" description is used, the solids percentages are values based on a composition where residual solvent is excluded, theoretically 100% dry solids composition after drying of all of the solvent.

The coating element effectively encapsulates raised relief structures without air entrapment. The combined thickness of the photoimageable layers depends on the relief pattern on the surface of the circuit substrate. Generally, the total thickness will be no greater than 100 microns (4-mils). When the permanent coating is photoprinted, development of the composition requires that the polyamic acid be sufficiently hydrophilic to render the permanent coating processable in aqueous alkaline developer. The coated and dried multilayer composition is directly imaged or exposed to actinic radiation to form a hardened coverlay layer. The entire multilayer coating composition in the unexposed areas will be removed in a single development step to leave a resist image on the substrate surface.

Coating Liquids

The photoimageable, permanent coating may be coated as a liquid onto the printed circuit substrate using any conventional coating process. The liquid may be a solution or a dispersion of the permanent coating composition wherein the solvent is removed sufficiently subsequent to coating to form a tack-free coverlay layer. The additional layer or layers are coated sequentially and dried. The liquids may be spray coated, roller-coated, spin-coated, screen-coated or printed as disclosed in Coombs supra, in DeForest supra, in Lipson et al., U.S. Pat. No. 4,064,287, or in Oddi et al., U.S. Pat. No. 4,376,815. The liquid, typically as a solution, may also be curtain coated as disclosed in Losert et al., U.S. Pat. No. 4,230,793. In the instance where printed circuits are manufactured on a continuous web of film substrate, permanent coating liquid may be coated by any conventional web coating process.

Temporary Support Film

Any of the support films generally known for use in photoresist films can be used. The temporary support film, which can have a high degree of dimensional stability to temperature changes, may be selected from a wide variety of polyamides, polyolefins, polyesters, vinyl polymers and cellulose esters, and may have a thickness ranging from 6 to 200 microns. A particularly preferred support film is polyethylene terephthalate having a thickness of about 25 microns. The temporary support film can be surface treated to improve release properties with substances such as silicones, providing the coating solution sufficiently wets the surface of the film to yield a uniform thickness coating. At least one surface of the support film may have a matte surface obtained by incorporation of filler particles in, or embossing the surface of, the temporary support film.

Cover Film

The photoimageable permanent coating layer may be protected by a removable cover film to prevent blocking when it is stored in roll form which is removed prior to lamination. The protective cover film may be selected from the same group of high dimensional stable polymer films described for the temporary support film, supra, and may have the same wide range of thicknesses. A cover film of 15-30 microns thick polyethylene or polypropylene, polyethylene terephthalate or silicone treated polyethylene terephthalate, are especially suitable. At least one surface of the cover film may have a matte surface obtained either by incorporation of filler particles in, or embossing the surface of, the cover film.

Photoimageable Coverlay Process

Photoimageable permanent coatings can be used as a solder mask to protect printed circuits during subsequent processing, primarily solder operations, and/or from environmental effects during use. Permanent coatings also are used as intermediate insulative layers, with or without development, in the manufacture of multilayer printed circuits.

In practice, the photoimageable multilayer coating composition typically between 10 and 50 micrometers (0.4 and 2-mils) thick, is applied to a printed circuit substrate which typically is a printed circuit relief pattern on a substrate that is semi-rigid or flexible. The photoimageable coating compositions may be sequentially coated as liquids and dried between layers or may be applied as a pre-coated multilayer composition on a temporary support. The multilayer composition may be applied to a printed circuit substrate either with vacuum lamination under pressure or with pressure-roll lamination with a solvent assist, with NMP being a particularly preferred solvent. The applied photopolymerizable composition is then imagewise exposed to actinic radiation to harden or insolubilize exposed areas. To improve photo-speed, a 10 minute bake at 80° C. after removal of the Mylar® temporary support sheet may preceed development. Any unexposed areas are then completely removed typically with an alkaline, aqueous sodium or potassium carbonate developer solution which selectively dissolves, strips or otherwise disperses the unexposed areas without adversely affecting the integrity or adhesion of the exposed areas. The developed permanent resist image is cured with a temperature profile that allows sufficient time at different temperatures for volatiles to escape and sufficient time at the peak cure temperature for imidization of the polyamic acid to occur. After cure the circuit board has a cured permanent resist layer covering all areas except unexposed areas that have been removed by development. Electrical components are then inserted into the through-holes or positioned on surface mount areas and soldered in place to form the packaged electrical component.

Permanent Coating Evaluation

Printed circuits must withstand a variety of tests that are dependent on the application of the circuits, which in turn governs the type of material used as the circuit substrate. A stringent application is for flexible printed circuits which require a fold or bend for a particular space requirement, such as a camera or video cassette recorder (VCR), and may require the capability of surviving multiple bends, such as in a computer disc drive. In some applications a flexible circuit is combined with a rigid circuit to form a flex-rigid multilayer printed circuit. The end use tests for flexible circuits focus on adhesion and the capability to withstand single or multiple bends. The process and several tests that are used to support the examples in this application are described below.

Dry Film Lamination

A pre-formed, dry-film, photopolymerizable multilayer coating is applied, after removal of a removable cover sheet, e.g., polyethylene or polypropylene used to protect the permanent coating element during storage, to the pre-cleaned copper printed circuit surface of the substrate with a NMP liquid assist using a Riston® HRL-24 Laminator. The roll temperature can vary from room temperature to 50° C. The multilayer coating can range in thickness from 10 to 100 microns (0.4 to 4-mils). The thickness that is used is determined by the thickness of the circuit traces. Although the laminate is typically imagewise exposed to actinic radiation through the temporary support film, in some instances, the temporary support may be removed before imaging to improve resolution and other such properties.

Typically, when a dry film is laminated without a liquid assist to a printed circuit substrate having a low circuit relief, measures must be taken to eliminate entrapped air, e.g., from around circuit lines. Entrapped air is eliminated by the vacuum lamination process of Fiel U.S. Pat. No. 4,127,436, or by the grooved roll lamination process of Collier et al., U.S. Pat. No. 4,071,367. A Solder Mask Vacuum Laminator (SMVL) is useful in eliminating entrapped air, but this laminator is limited to atmospheric pressure after the evaluation cycle. If higher pressure is needed, the SMVL lamination can be followed by a hot press lamination, or alternatively a vacuum press can be used for the lamination.

Time to Clear

This test evaluates the retention time for adequately developing photoimageable coverlay. The multilayer coating is laminated onto a rigid or flexible substrate, then timed when placed through a one-percent aqueous sodium carbonate or potassium carbonate developer solution (which should be at the same temperature as that used in actual processing, typically 26 to 40° C.). The total "time to clear" is reported in seconds, beginning from the time the sample enters the developer and ending at the time at which the unexposed coverlay is washed off of the substrate. Exposed samples are generally then developed at two times the time to clear.

Photo-Speed

This test evaluates the processability of coverlay. Green coverlay is laminated onto a substrate, then is exposed to 250 to 1500 mj/cm$^2$ UV through a 21-step Stouffer sensitivity photopattern. After the sample is developed, the resulting step-wedge pattern is analyzed. Values are reported in a X-Y range, in which the X value is the last step in which no developer attack is noted and Y is the last step containing coverlay. The optimum exposure level is obtained at a Y value of 10 to 12. High X values indicate low attack of the photopolymer by the developer.

Encapsulation

This test evaluates the capability of coverlay to adequately protect the substrate. The substrate and coverlay chosen for this test should represent those in end-use applications. The substrate is typically a circuit pattern and is processed with the coverlay exactly as is done in actual manufacturing. After processing, the sample is evaluated using 10× magnification for any haloing, air entrapment, and/or delaminations, which constitute a failure. In addition, the sample also may be cross-sectioned along the edge of a circuit line and evaluated using magnification to ensure that coverlay adequately covers the area with no "soda-strawing" defects. Before samples are processed further they should pass this encapsulation test.

Cross-Hatch Adhesion

This test is performed according to ASTM D-3359-79, Method B. Test substrates are selected to duplicate the material typically used for end-use, and are processed to mirror actual processing.

Test substrates, typically a Pyralux® AP 8525 substrate with copper etched off of one side, are either chemically cleaned substrates or substrates used without any pre-cleaning or etching of the copper surface. The samples that are chemically cleaned are cleaned in a series of steps with immersion first in Versa Clean® 415 for 2 minutes at 45° to 50° C. followed by immersion for 30 seconds in a deionized water bath. The samples are then immersed in Sure Etch® 550 micro etching solution for one minute at 35° C., followed by a deionized water rinse for 30 seconds. The samples are finally immersed in 10% sulfuric acid solution at room temperature for 30 seconds and given a final deionized water rinse. Samples are dried and placed immediately in a nitrogen atmosphere until used.

The test areas are a blank copper area and a blank adhesive area. Specimens are tested "after cure" as well as "after solder" exposure, which simulates solder exposure during PCB fabrication. Typical "after solder" specimens are floated in 288° C. 60/40 tin/lead solder for 30 seconds. Residual solder is then removed before evaluation. All specimens are scored with a 10 blade Gardco blade, then the sample is rotated 90° and rescored so that a cross-hatch pattern comprised of 100 squares is cut into the coverlay surface. Adhesive tape is applied and rubbed to ensure good contact, then pulled away at a 90° angle in a smooth fluid motion. The sample is examined using 10× magnification for delaminations. Pick off from the cutting blade of 1-2% is not considered a failure but >2% pickoff is a failed sample.

Bend & Crease

The substrate to be used for this test is typically a MIT flexural endurance pattern. The MIT pattern is a meander pattern that has alternating one mm lines and spaces in the region of the testing. The sample is creased in a 180° fold perpendicular to the direction of the lines and spaces. The substrate is typically the same type as that used in the actual product application. The thickness and type of substrate (copper, adhesive) and the processing steps (pre-clean, lamination, cure, solder exposure) are duplicated so that the evaluation reflects a true simulation. Typically a Pyralux® AP 8525 substrate is used with the copper etched off of one side. The polyimide thickness for this laminate is 2-mils and the copper thickness from the 0.5 oz/ft$^2$ copper layer is 18 micrometers. The CTE of the polyimide for this laminate is 23 ppm/° C.+/−10%. Samples are bent and creased by hand in 10 different areas of each sample, then examined using 10× magnification for defects such as cracks or delaminations. Any reported defects constitute a failure. Samples are evaluated "after cure" and "after solder", in which case samples are floated, coverlay side up, in 288° C. 60/40 tin/lead solder for 30 seconds, then cooled to room temperature and evaluated as described above.

Curl Assessment

The curl assessment is made with samples of two MIT patterns that are prepared as described for the bend/crease tests. The patterns are 1.62 inches across for the two MIT patterns. After cure the MIT samples are cut into 0.5 inch wide strips 90° to the copper traces using a JDC Precision Sample Cutter from Thwing-Albert Instrument Co. The 0.5 inch×1.62 inch samples are placed on a flat surface with the concave surface facing the flat surface. The distance from the high point of the sample from the flat surface is measured with a ruler in millimeters. A positive curl is denoted when the concave side is the side of the photoimageable coverlay. A negative curl is denoted when the concave side is the back side of the MIT test laminate.

EXAMPLES

The advantageous properties of this invention can be observed by reference to the following examples, which illustrate, but do not limit, the invention. All parts and percentages are by weight. The compositions are given with solvent(s) as coating solutions and the percentages are the percentage of coating solution including solvent. Materials used for the examples are:

| Initiators | |
|---|---|
| o-C1 HABI | Hexaarylbiimidazole |
| EMK | Ethyl Michler's Ketone |
| C314T | Coumarin 314T: 2,3,6,7-tetrahydro-1,1,7,7-tetramethyl-11-oxo-1H,5H,11H-(1)benzopyrano[5,7,8-ij]quinolizine-10-carboxylic acid ethyl ester from Acros Organics, Fair Lawn, NJ |
| Quanticure ® ITX | Mixture of 2- and 4-isopropylthioxanthone from Aceto Chemical Co. |
| Irgacure ® 907 | 2-methyl-1-[4-(methylthio)phenyl]-2-(4-morpholinyl)-1-propanone from Ciba-Geigy Corporation, Hawthorne, NY |
| Other Ingredients | |
| Dimethylamino dimethacrylate | From Aldrich, Milwaukee, WI |
| BM611 | Mhoromer ® BM611: dimethylaminopropyl methacrylamide from Huls American Inc., Placataway, NJ |
| MADEMA | PRO-754: N-methyldiethylamino dimethacrylate from Sartomer Company, Exton, PA |
| Ebecryl ® 7100 | Acrylated amine oligomer acrylate from UCB Chemicals Corp., Smyrna, GA |
| TMPTA | Trimethylolpropane triacrylate from UCB Chemicals Corp., Smyrna, GA |
| Ebecryl ® 110 | Oxyethylated phenol acrylate from UCB Chemicals Corp., Smyrna, GA |
| SR259 | Polyethylene glycol (200) diacrylate diacrylate from Sartomer Company, Exton, PA |
| CD 406 | Cyclohexane dimethanol diacrylate from Sartomer Company, Exton, PA |
| CBT | Benzotriazole-5-carboxylic acid from Aldrich, Milwaukee, WI |
| Sevron ® Blue GMF | Green dye from Crompton & Knowles Corp., Reading, PA |
| 3-MT | 3-mercapto-1H,2,4-triazole from Esprit Chemical Co., Rockland, MA |

Polyamic acids for the examples were prepared by the method of: The diamine or a mixture of diamines are combined with a dry solvent, either N,N-dimethyl acetamide (DMAC) or N-methyl-2-pyrrolidinone (NMP) and the solution or mixture is stirred mechanically under nitrogen as the dianhydride or mixture of dianhydrides are added over a period of 2 to 4 hours with temperature held below 40° C. The solution is stirred for 2 to 12 hrs with no heat added before the end-capping agent, with mono-anhydride or chain extender, is added. The polyamic acid solutions are filtered through a 25-micrometer filter and kept refrigerated prior to use.

Polyamic acid molecular weights were determined by gel permeation chromatography (GPC) and the relative weight average molecular weights were based on calibration with polystyrene standards.

The polyamic acids used in the examples, which contain the mole-percent of dianhydride, diamine, end-cap and chain extenders in parentheses, are:

Polyamic acid 1: BPDA(100)//PPD(100); MW 34,000; 25% solids in DMAC; Tg is 360° C.

Polyamic acid 2: BPDA(100)//PPD(100); MW 181,000; 15% solids in DMAC; Tg is 360° C.

Polyamic acid 3: BPDA(85.8)/PMDA(14.2)//PPD(86)/ODA (9.5); MW is 230,000; lone-percent solids in DMAc.

Polyamic acid 4: PMDA(100)//PPD(60)/ODA(40); MW is 367,000; 12% solids; CTE of polyimide is 30 ppm/° C.; Tg is 375° C.

Polyamic acid 5: BPDA(91.15)//PPD(100)//BPDA tetraacid (8.4); MW is 87,700; 22% solids in DMAC; CTE of polyimide is 10 ppm/° C.; Tg is 360° C.

Polyamic acid 6: ODPA(80)PMDA(20)//RODA(50)/HMD (50); MW is 164,000; 25% solids in DMAC; CTE of polyimide is 60 ppm/° C.; Tg is 178° C.

Polyamic acid 7: BPDA(95.2)//PPD(100)//BPDA tetraacid (4.8): MW is 89,800; 22% solids in DMAc; Tg is 360° C.

Polyamic acid 8: ODPA(100)//RODA(49.6)/HMD(49.6); MW is 121,000; 25% solids in DMAc; Tg is 170° C.

Polyamic acid 9: BPDA(98.5)//PPD(100)//MA(3); Mw is 28,800; 25.one-percent solids in DMAC; CTE of polyimide is 10 ppm/° C.; Tg is 360° C.

Polyamic acid 10: BPDA(91.51)//PPD(100)//BPDA tetraacid (8.51): MW is 50,300; 25.one-percent solids in DMAC; CTE of polyimide is 10 ppm/° C.; Tg is 360° C.

Polyamic acid 11: BPDA(90.72)//PPD(90)/ODA(10)//PMDA tetraacid(9.35): MW is 44,000; 25% solids in DMAC; CTE of polyimide is 18 ppm/° C.

Polyamic acid 12: ODPA(100)//MPD(40)/RODA(30)/HMD (30)//MA(3): MW is 103,000; 25.one-percent solids in DMAc; CTE of polyimide 60 ppm/° C.

Polyamic acid 13: BPDA(90)/PMDA(10)//PPD(90)/ODA (10); Mw is 47,800; 25% solids in DMAc; CTE of polyimide 18 ppm/° C.; Tg is 350° C.

Polyamic acid 14: ODPA(99.92)//HMD(100); MW is 44,700; 25% solids in DMAc.

Glossary

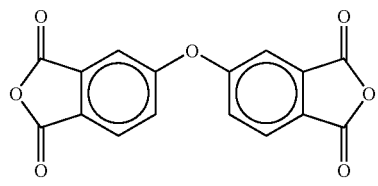

ODPA

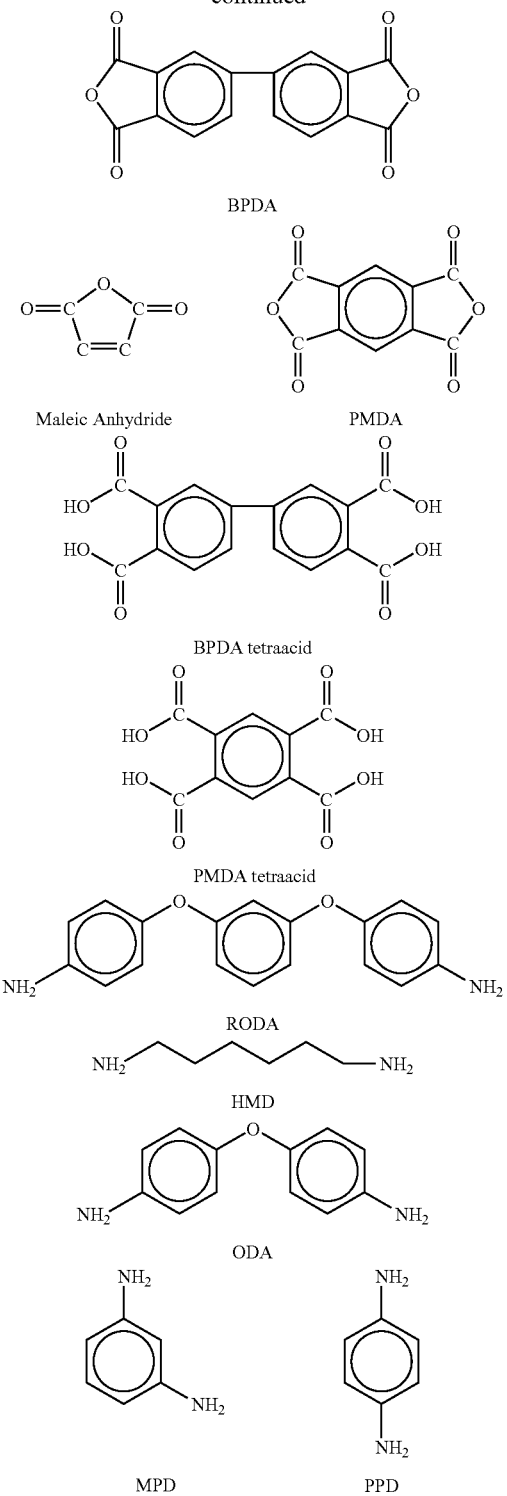

Examples 1A-1D

Examples 1A-1D illustrate that low MW polyamic acid that is needed for development does not lead to flexible polyimide after cure. Although these coatings are not photosensitive, coatings of the polyamic acid alone are useful to assess developability in one-percent aqueous sodium carbonate solution and flexibility after cure, since the presence of photopolymer does not aid flexibility. With enough increase in MW, flexibility can be obtained as seen with Example 1D, however the high MW polyamic acids will not develop. The polyamic acid solutions were coated with a 4-mil doctor knife on 1-mil Mylar® and dried in a forced draft oven for 4 min. at 80° C. The dried coatings were laminated with NMP liquid assist using a hot roll lamination with roll temperature of 50° C. and the pressure of 40 psi and at a throughput of 0.6 meters/min. After lamination, the Mylar® cover sheet was removed. The laminated samples baked at 80° C. for 10 min., and then cured with a temperature profile of 5° C./min from room temperature to 300° C. with a hold at 300° C. for 10 min. The cured samples were then removed from the 300° C. oven and cooled to room temperature. The cured thickness of the cured polyimide layer was 80% of the coating thickness of the polyamic-acid layer thickness before curing.

| Example | Polyamic acid | Thickness of polyamic acid layer (mils) |
| --- | --- | --- |
| 1A | 1 | 0.5 |
| 1B | 2 | 0.6 |
| 1C | 3 | 1.0 |
| 1D | 4 | 1.0 |

| Example | Development (sec at 80° F.) | Flexibility (bend/crease) |
| --- | --- | --- |
| 1A | 48 | fail |
| 1B | 89 | fail |
| 1C | did not develop | fail |
| 1D | did not develop | pass |

Examples 2A and 2B

Example 2A is a two-layer composition that illustrates good adhesion with development because of the thin adhesive layer. In addition this example has a chain extender-modified polyamic acid so that a low MW polyamic acid having a low CTE of 10 ppm/° C. could be used that is developable. During cure, the chain extender allows an increase in MW so that the cured polyimide is flexible. Example 2B illustrates that poor adhesion is obtained when the thin adhesive layer is not used. Polyamic acid 5 has a molecular weight at the high end of the range that is developable.

Example 2A

| | Cover layer (% by weight) | Adhesive layer (% by weight) |
| --- | --- | --- |
| Polyamic acid 5 (25% in DMAc) | 91.36 | 0 |
| Polyamic acid 6 (25% in DMAc) | 0 | 90.33 |
| Ebecryl ® 7100 | 0.87 | 4.83 |
| Ebecryl ® 110 | 1.55 | 1.94 |
| Dimethylamino-ethyl methacrylate | 1.42 | 1.63 |
| SR259 | 3.70 | 0 |
| 0-CI-HABI | 0.87 | 0.95 |
| C314T | 0.14 | 0.18 |
| 3-MT | 0.04 | 0.04 |
| CBT | 0 | 0.04 |
| Sevron Blue GMF | 0.03 | 0.03 |
| Layer thickness | 0.7 mil | 0.3 mil |

The cover layer was coated on one-mil Mylar® film using a 2-mil doctor knife and dried in a forced draft oven at 80° C. for 2 min. The adhesive layer composition was coated over the dried cover layer composition with a 1-mil doctor knife followed by drying for 2 min. at 80° C. The two-layer coating had a 0.7 mil thick top photosensitive layer and a 0.3 mil thick bottom photosensitive layer on the Mylar® temporary support film. The two-layer photosensitive coating was laminated to test substrates using a NMP-liquid assist with a pressure-roll laminator with the roll temperatures at 50° C. and at a throughput of 0.6 meters/min. Samples were exposed at 1500 mj/cm$^2$. After exposure, the Mylar® cover sheet was removed and samples were baked at 80° C. for 10 min. The samples were developed in one-percent aqueous sodium carbonate solution at 80° F. with a time to clear of 284 sec. The step-wedge image had 10 $\sqrt{2}$ steps and no development residue was present on the developed samples. MIT etched patterns, prepared from Pyralux® AP 8525 all polyimide laminates were well encapsulated. The samples were cured with the cure profile of Examples 1A to 1D. Occasional blistering can be avoided with an improved cure profile. A useful profile is a ramp rate of 7° C./min to 245° C., a hold at 245° C. for 30 min. and a ramp rate of 7° C./min to 300° C. with an additional hold for 10 min. The MIT samples passed bend/crease testing. The samples for curl measurement appeared flat with the curl assessed at below 1 mm. The thickness after cure was 0.8 mil.

Example 2B is a coating of the cover layer composition only that was coated with a 4 mil knife and dried at 80° C. for 3 min. to yield a 1-mil thick coating. This was laminated, exposed and developed as the two-layer composition of Example 2A, but the composition did not adhere during development with the entire coating washing off of the test substrates.

Examples 3A-3F

Compared to Examples 3B-3F, Example 3A illustrates the difference in performance achieved with the addition of a solvent, CHP, that does not substantially extract out of the coating composition during development so that the developed samples are flat.

The adhesive layer composition of Example 2A was tested with different solvents added to the composition before coating to see if there would be any improvement in flatness of flexible circuits after exposure and development. The coating compositions were coated using a 4-mil doctor knife on 1-mil Mylar®. The samples were dried at 80° C. for 4 min. to yield 1-mil thick coating (i.e. Examples 3A, 3B, 3C, 3E and 3F). Example 3D was 0.9 mil.

The coatings were laminated to MIT patterns made from Pyralux® AP8525 using a Solder Mask Vacuum Laminator at 87.5° C., followed by hot press lamination at 93° C., 62.5 psi for 30 sec. Samples were exposed 100 mj/cm$^2$ and developed at 2× the time to clear in one-percent aqueous sodium carbonate solution at 105° F. The time to clear was 7 sec for Example 3B, 8 sec for Examples 3A, 3D and 3F and 9 sec for Examples 3C and 3E. CHP in Example 3A proved to be the best candidate. The amount of solvent added altered the solvent composition from 100% DMAc to 77.2% DMAc and 22.8% of the additional solvent. Samples were tested on MIT patterns and the amount of curl was assessed by visual inspection. The solvents tested are:
  (i) N-cyclohexyl-2-pyrrolidinone (CHP);
  (ii) N,N-dimethyl acetamide (DMAc);
  (iii) Dimethyl sulfoxide (DMSO);
  (iv) Gamma-butyrolactone (BLO);
  (v) 2-phenoxy ethanol (2-PE);
  (vi) Alpha-methylene gamma-butyrolactone (α-MBL)

| Example | Solvent | Curl with Hold Time after Development | | |
|---|---|---|---|---|
| | | 15 min | 2 hrs | 18 hrs |
| 3A | CHP | 0 | 0 | 0 |
| 3B | DMAc | 3 | 3 | 3 |
| 3C | DMSO | 4 | 3 | 3 |
| 3D | BLO | 2 | 4 | 4 |
| 3E | 2-PE | 0 | 1 | 1 |
| 3F | α-MBL | 3 | 5 | 5 |

The rating for the curl assessments is:

| Rating | Description |
|---|---|
| 0 | no curl |
| 1 | slight curl |
| 2 | curl on one edge |
| 3 | curl on both sides |
| 4 | more curl than 3 |
| 5 | more curl than 4 |

Examples 4a and 4b

Examples 4A and 4B illustrate the difference in photo-speed that quenching of the inhibitor, with a pre-reaction with potassium sulfite, makes before using the polyamic acid in a coating composition.

Example 4A has a pre-treatment and Example 4B does not. For Example 4A, the polyamic acid was stirred with an excess of potassium sulfite overnight. A small amount of DMAC was added to aid filtration and the coating composition was filtered through a 10-micrometer filter, or alternatively centrifuged, to remove excess potassium-sulfite particles. Example 4B uses polyamic acid that was not pre-reacted with potassium sulfite.

Example 4A

| | Cover layer (% by weight) | Adhesive layer (% by weight) |
|---|---|---|
| | Example 4A | |
| Polyamic acid 7 (22% in DMAc) | 91.37 | 0 |
| Polyamic acid 8 (25% in DMAc) | 0 | 90.32 |
| Ebecryl ® 7100 | 0.88 | 0.98 |
| Ebecryl ® 110 | 1.61 | 1.77 |
| Dimethylamino- ethyl methacrylate | 1.42 | 1.63 |
| SR259 | 3.69 | 4.12 |
| O-CI-HABI | 0.88 | 0.97 |
| C314T | 0.07 | 0.07 |
| 3-MT | 0 | 0.07 |
| Benzotriazole-5-carboxylic acid | 0 | 0.07 |
| Sevron Blue GMF | 0.02 | 0.03 |
| Doctor knife, mil | 4 | 1 |
| Min dry at 80° C. | 2 | 2 |
| Layer thickness | 0.7 mil | 0.3 mil |
| | Example 4B | |
| Polyamic acid 7 | 91.37 | 0 |
| Polyamic acid 6 | 0 | 90.33 |
| Ebecryl ® 7100 | 0.88 | 4.83 |
| Ebecryl ® 110 | 1.54 | 1.94 |
| Dimethylamino- ethyl methacrylate | 1.42 | 1.63 |
| SR259 | 3.69 | 0 |
| O-CI-HABI | 0.88 | 0.95 |
| C314T | 0.15 | 0.18 |
| 3-MT | 0.07 | 0.04 |
| Benzotriazole-5-carboxylic acid | | 0.04 |
| Sevron Blue GMF | 0.02 | 0.03 |
| Doctor knife, mil | 2 | 1 |
| Min dry at 80° C. | 2 | 2 |
| Layer thickness | 0.7 mil | 0.3 mil |

Examples 4A and 4B were processed the same as the samples in Example 2A except that the pressure-roll laminator was used at room temperature instead of 50° C. With a 500 mj/cm$^2$ exposure, Example 4A yielded a significant improvement in photo-speed with 4 $\sqrt{2}$ steps more photopolymer than Example 4B (which is a four time increase in photo-speed). Moreover, the step-wedge image of Example 4A did not show the chemical attack, by developer that was present in Example 4B. The first 7-steps of photopolymer for Example 4A were not attacked, whereas only the first 2-steps of photopolymer were not attacked in Example 4B.

Although there is a different adhesive layer composition for these examples, when these adhesive layer compositions are coated as a single layer they have the same photo-speed. In addition when the cover layer alone for Examples 4A and 4B were evaluated as single layers with exposure of 1500 mj/cm$^2$, the cover layer for 4B completely washed off. The cover layer of Example 4A adhered to the copper substrate, although the photopolymer was somewhat attacked by developer, indicating the advantage of the thin adhesive layer. For these single layer experiments, the cover layer coating solution from Example 4A was coated with an 8 mil doctor knife and dried for 4 min. at 80° C. to yield a 1-mil thick coating. The cover layer coating solution from Example 4B was coated with a 4 mil doctor knife and dried for 3 min. at 80° C. to yield a 1-mil thick coating. Quenching of the inhibitor allows more in depth polymerization to the substrate, improving developer resistance.

| Coating Composition | TTC (80° F.) | Exposure (mi/cm$^2$) | $\sqrt{2}$ Step-wedge Image[1] |
|---|---|---|---|
| Example 4A (2-layer) | 182 | 500 | 7/11 |
| Example 4B | 421 | 500 | 2/7 |

-continued

| Coating Composition | TTC (80° F.) | Exposure (mj/cm²) | √2 Step-wedge Image[1] |
|---|---|---|---|
| (2-layer) Example 4A (adhesive layer) | 10 | 50 | 2/10 |
| Example 4B (adhesive layer) | 20 | 50 | 2/10 |
| Example 4A (cover layer) | 339 | 500 | <2/11 |

[1](number of non-attacked steps/last polymerized step)

Example 5

Example 5 is an example of a three-layer composition. The middle layer contains a polyamic acid that cures to a low CTE polyimide. The top and adhesive layers are the same composition and contain a polyamic acid that cures to a polyimide that has a higher CTE, but these layers have good photo-speed and the adhesive layer gives good adhesion.

The polyamic acid in the middle layer was end-capped with maleic anhydride, so this polyamic acid does not have the capability of chain extending during cure as in Example 2A, therefore the sample is not flexible after cure. This example also illustrates that there is a CTE mismatch of the cured 3-layer composition with the polyimide of the base substrate with curl observed. The polyimide obtained from the polyamic acid for the middle layer has a low CTE of 10 ppm/° C. and the polyamic acid has a low MW of 28,800, allowing developability.

| Coating Composition | Middle Layer (% by weight) | Top and Bottom Layers (% by weight) |
|---|---|---|
| Polyamic acid 9 | 97.15 | 0 |
| Polyamic acid 6 | 0 | 90.33 |
| Ebecryl® 7100 | 0 | 4.83 |
| Ebecryl® 110 | 1.74 | 1.99 |
| TMPTA | 0 | 1.63 |
| SR259 | 0- | 0- |
| Irgacure® 907 | 0.84 | 0.95 |
| Quanticure® ITX | 0.13 | 0.18 |
| EMK | 0.13 | 0 |
| 3-MT | 0.06 | 0.04 |
| Sevron Blue GMF | 0.03 | 0.03 |
| Layer thickness | 0.5 mil | 0.3 mil (for each top and adhesive layer) |

The first layer, which was the cover layer when the 3-layer coating was laminated to the test substrate, was coated with a 1-mil doctor knife on 1-mil Mylar® film, and dried at 80° C. for 2 min. This was over coated with the middle layer composition with a 2-mil doctor knife and dried at 80° C. for 2 min. Finally, the last (bottom) layer was coated over the two-layers with a 1-mil doctor knife and the three-layer coating dried at 80° C. for 3 min. The coating was laminated as described in Example 2A.

After a 500 mj/cm² exposure, the Mylar® cover sheet was removed and the sample baked at 80° C. for 10 min. The time to clear (TTC) was 38 sec in one-percent aqueous sodium carbonate at 80° F. The developed step wedge image had 6 √2 steps that were not attacked by developed and the last partially polymerized step was 9 √2 steps.

After the cure profile (the profile used in Examples 1A to 1D), the MIT patterns prepared from Pyralux® AP 8525 did not pass bend/crease and the samples had a curl of 3 mm. An increase in middle layer thickness relative to the combined thickness of the top and adhesive layers would be necessary to eliminate the curl.

Examples 6A to 6F

Examples 6A to 6F show the importance of having a CTE match of the polyimide composition with the CTE of the polyimide film of the base-laminate. For these examples, the base flexible laminate is MIT patterns on Pyralux® AP.

The polyimide of this laminate has a CTE of 23 ppm/° C.+/−10%. The composite CTE is calculated based on the CTE of the polyimide structure in each layer. There is seen low-to-no curl when the composite CTE is close to the same CTE as Pyralux® AP. However, when the CTE is lower (or higher), a negative (or a positive curl) can occur.

To achieve the negative curl samples, a coating of selected polyamic acids were tested without added photosensitive components. All of the compositions were laminated with NMP assist as Example 2A.

Example 6A is polyamic acid 10 and Example 6B is polyamic acid 11. Both solutions were coated with no other components added with a 4-mil doctor knife on 1-mil Mylar® film. The coatings were dried in a forced draft oven at 80° C. for 4 min. to yield a 0.8-mil thick coating for Example 6A and a 1.0 mil thick coating for Example 6B. These were then wet laminated with NMP assist (as in Example 2A) to MIT patterns. The samples were dried at 80° C. for 10 min. and cured with the same thermal profile as Examples 1A to 1D. The cured thickness was 80% of the thickness of the polyamic acid layer before cure.

The polyamic acids of Examples 6A and 6B did not yield single layer photosensitive compositions that would withstand developer attack, so these examples were tested without adding the components to make photosensitive coatings.

In Example 6C, the cover layer coating solution was coated on 1-mil Mylar with a 2-mil doctor knife followed by a 2 min. bake at 80° C. The adhesive layer composition was coated over this dried layer with a 1-mil doctor knife followed by a 3-min bake at 80° C.

| Coating Composition | Cover layer (% by weight) | Adhesive layer (% by weight) |
|---|---|---|
| Polyamic acid 10 | 90.29 | 0 |
| Polyamic acid 12 | 0 | 90.29 |
| Ebecryl® 7100 | 0.99 | 4.88 |
| Ebecryl® 110 | 1.76 | 1.94 |
| BM611 | 1.62 | 1.62 |
| SR259 | 0 | 4.15 |
| 0-Cl-HABI | 0.99 | 0.99 |
| C314T | 0.18 | 0.18 |
| 3-MT | 0.04 | 0.04 |
| Benzotriazole-5-carboxylic acid | 0 | 0.04 |
| Sevron Blue GMF | 0.03 | 0.03 |
| Layer thickness | 0.7 mil | 0.3 mil |

In Example 6D, the cover layer coating solution was coated on 1-mil Mylar® with a 2.5 mil doctor knife followed by a 2 min. bake at 80° C. The adhesive layer composition was coated over this dried layer, after 2.5 grams of DMAc was added, with a 1-mil doctor knife followed by a 2-min bake at 80° C.

| Coating Composition | Cover layer (% by weight) | Adhesive layer (% by weight) |
|---|---|---|
| Polyamic acid 9 | 90.29 | 0 |
| Polyamic acid 6 | 0 | 90.33 |
| Ebecryl ® 7100 | 0.99 | 4.83 |
| Ebecryl ® 110 | 1.76 | 1.99 |
| TMPTA | 1.62 | 1.63 |
| BM611 | 0 | 0 |
| SR259 | 0 | 4.15 |
| Irgacure ® 907 | 0.99 | 0.95 |
| Quanticure ® ITX | 0.18 | 0.18 |
| 3-MT | 0.04 | 0.04 |
| Sevron Blue GMF | 0.03 | 0.03 |
| Layer thickness | 0.7 mil | 0.3 mil |

In Example 6E, the cover layer coating solution was coated on 1-mil Mylar® with a 2-mil doctor knife followed by a 2 min. bake at 80° C. The adhesive layer composition was coated over this dried layer with a 1-mil doctor knife followed by a 2-min bake at 80° C.

| Coating Composition | Cover layer (% by weight) | Adhesive layer (% by weight) |
|---|---|---|
| Polyamic acid 11 | 90.33 | 0 |
| Polyamic acid 12 | 0 | 90.29 |
| Ebecryl ® 7100 | 0.95 | 4.88 |
| Ebecryl ® 110 | 1.76 | 1.94 |
| Dimethylamino-ethyl methacrylate | 1.63 | 1.63 |
| SR259 | 0 | 4.16 |
| 0-Cl-HABI | 0.95 | 0.99 |
| C314T | 0.18 | 0.18 |
| 3-MT | 0.05 | 0.05 |
| Sevron Blue GMF | 0.03 | 0.03 |
| Layer thickness | 0.7 mil | 0.3 mil |

In Example 6F, the cover layer coating solution was coated on 1-mil Mylar® with a 1-mil doctor knife followed by a 2 min. bake at 80° C. The middle layer composition was coated over this dried layer with a 2-mil doctor knife followed by a 2 min. bake at 80° C. The adhesive layer composition was coated over the 2-layer coating with a 1-mil doctor knife followed by a 2-min bake at 80° C.

| Coating Composition | Middle Layer (% by weight) | Top and Bottom Layers (% by weight) |
|---|---|---|
| Polyamic acid 13 | 96.04 | 0 |
| Polyamic acid 12 | 0 | 90.28 |
| Ebecryl ® 7100 | 0 | 4.88 |
| Ebecryl ® 110 | 1.50 | 1.84 |
| Dimethylamino-ethyl methacrylate | 1.38 | 1.62 |
| Irgacure ® 907 | 0.84 | 0.98 |
| Quanticure ® ITX | 0.15 | 0.14 |
| C314T | 0 | 0.14 |
| 3-MT | 0.04 | 0.07 |
| Sevron Blue GMF | 0.03 | 0.03 |
| Layer thickness | 0.7 mil | 0.3 mil (each layer) |

Examples 6C to 6F were laminated and cured with the same cure profile as Examples 1A-1D, but the improved cure profile described in Example 2A is preferable to eliminate blisters in the cured composition.

Example 6C was exposed 2000 mj/cm$^2$, Example 6D for 500 mj/cm$^2$ and Example 6F for 1000 mj/cm$^2$. The time to clear in one-percent aqueous sodium carbonate solution at 80° F. was 52 sec for Example 6C, 21 sec for Example 6D and 16 sec for Example 6F. The $\sqrt{2}$ steps of photopolymer image after development was 2-10 steps for Examples 6D and 6F and 2-7 steps for Example 6C. Example 6E had such poor photo-speed that it was not developed, but cured after exposure to assess curl after cure. The cured thickness for Examples 6C-6F was 60% of the thickness of the photosensitive coating layers after coating.

| Example | Thickness[1] | Curl (mm) | Calculated CTE[2] (ppm/° C.) |
|---|---|---|---|
| 6A | 1.0 | −8.4 | 10 |
| 6B | 1.0 | −3.0 | 18 |
| 6C | 0.7/0.3 | <1.0 | 25 |
| 6D | 0.7/0.3 | <1.0 | 25 |
| 6E | 0.7/0.3 | 1.7 | 31 |
| 6F | 0.3/0.7/0.3 | 5.0 | 37 |

[1]Thickness of cover layer/adhesive layer or cover layer/middle layer/adhesive layer in mils before cure.
[2]Calculation of composite CTE of cured composition was made based on the thickness of each layer and the CTE of the polyimide in each layer according to the expression:
$CTE_{composite} = \Sigma [CTE_{layer\ 1} (t_1/t_{total}) + CTE_{layer\ 2} (t_2/t_{total}) + CTE_{layer\ n} (t_n/t_{total})]$ where CTE of the layer is the CTE for the polyimide of the layer, t total = total thickness after coating, $t_1$ = thickness of layer 1, etc. The absolute value of the $(CTE_{Comp} - CTE_{Sub})/CTE_{Sub}$ is less than approximately 0.10.

Examples 7A and 7B

Example 7A shows the importance of an amine acrylate to achieve a compatible coating composition that can withstand developer attack after exposure. Since the polyamic acid is very polar, the use of relatively non-polar photo-monomers that do not form a salt with the polyamic acid does not lead to a compatible coating composition as Example 7A indicates.

Example 7B contains an amine acrylate photo-monomer that forms a compatible coating composition. The equivalent weight is very similar, 126 g/mole for SR406 and 128 g/mole for MADEMA, but after exposure, samples of Example 7A do not withstand developer attack.

| Coating Composition | Example 7A (% by weight) | Example 7B (% by weight) |
|---|---|---|
| Polyamic acid 14 | 94.10 | 94.10 |
| Ebecryl ® 110 | 1.19 | 1.19 |
| MADEMA | 0 | 3.51 |
| CD406 | 0 | 3.51 |
| Irgacure ® 907 | 0.88 | 0.88 |
| Quanticure ® ITX | 0.13 | 0.13 |
| 3-MT | 0.13 | 0.13 |
| Sevron Blue GMF | 0.03 | 0.03 |
| Layer thickness | 0.9 mil | 1.0 mil |

Each coating solution was coated on one-mil Mylar® film using a 4-mil doctor knife. The samples were dried in a forced draft oven at 80° C. for 4 min. Example 7A gave an incompatible coating, whereas Example 7B gave a compatible coating.

The coated compositions were processed as Example 2A, except that the coatings were laminated to MIT patterns that are based on Teclam® FNC 110 laminate with pressure rolls at room temperature. These are "epoxy-based" laminates. These laminates can be used at a cure temperature below 160° C.

The laminate is made with a 1-mil thick epoxy adhesive on 1-mil Kapton® film and 35-micrometer thick roll annealed copper foil. Both examples had a time to clear of 8 sec in one-percent aqueous sodium carbonate solution at 80° F.

Developed samples of Example 7A, even with a 1500 mj/cm$^2$ exposure did not withstand developer attack. A step-wedge image of Example 7B gave 10 $\sqrt{2}$ steps of photopolymer after a 50 mj/cm$^2$ exposure. Cured samples of these examples would have curl since they are single layer coatings applied to just one side of the flexible substrate.

What is claimed is:

1. A multi-layer composite coverlay substrate, comprising:
   A. an adhesive layer having a thickness in a range between and including 1-20 microns, comprising:
      i. an adhesive polyamic acid precursor curable to an adhesive polyimide base polymer wherein said adhesive base polymer exhibits a glass transition temperature ("Tg") between and including 170° C. and 250° C.;
      ii. an ethylenically unsaturated photo-monomer wherein at least 2 percent by weight of the photo-monomer is an amine acrylate, a methacrylate having amine functionality, or a combination of the two;
   B. a cover layer adjacent to the adhesive layer having a thickness between 10 and 75 microns, comprising:
      i. 60 to 83.9 percent by weight (on a dry solids basis) cover layer polyamic acid precursor curable to a cover layer polyimide base polymer having a glass transition temperature (Tg) from 10° C. to 100° C. greater than the glass transition temperature of the adhesive polyimide base polymer, the cover layer polyamic acid precursor comprising:
         a. 95 to 100 mole % diamine component,
         b. 85 to 99 mole % dianhydride component,
         c. 1 to 15 mol % tetra carboxylic acid wherein the amount of tetracarboxylic acid is based on the amount of corresponding dianhydride needed to react with the unreacted diamine ends, and wherein the cover layer polyamic acid precursor has a weight-average molecular weight equal to or below 50,000, and
      ii. 15 to 35 percent by weight (on a dry solids basis) an ethylenically unsaturated photo-monomer where at least 2 percent by weight of the photo-monomer is an amine acrylate, a methacrylate having amine functionality, or a combination of the two;
      iii. 1 to 10 percent by weight, on a dry solids basis, of a photo-initiator; and
      iv. 0.1 to 1.0 percent by weight (on a dry solids basis) a visible light sensitizer;
   wherein the overall in-plane coefficient of thermal expansion ("CTE"), of the coverlay is between 10 and 40 ppm/° C. measured at 30° C.

2. A coverlay substrate in accordance with claim 1, wherein the cover layer polyamic acid is derived from the polymerization of a dianhydride and diamine, wherein the dianhydride is selected from the group consisting of biphenyltetracarboxylic dianhydride (BPDA), pyromellitic dianhydride (PMDA) and mixtures of BPDA and PMDA.

3. A coverlay substrate in accordance with claim 1 wherein the cover layer polyamic acid is derived from the polymerization of a dianhydride and diamine wherein the diamine is selected from the group consisting of p-phenylene diamine, or mixtures of p-phenylene diamine with diaminobenzanilide.

4. A coverlay substrate in accordance with claim 3, wherein the diaminobenzanilide is selected from a group consisting of 2-methoxy-4,4'-diaminobenzanilide, 2'-methoxy-4,4'-diaminobenzanilide and 2,2'-dimethoxy-4,4'-diamino-benzanilide.

5. A coverlay substrate in accordance with claim 1 wherein the photo-monomer is selected from a group consisting of N-methyldiethylamino dimethacrylate, dimethylaminopropyl methacrylamide, dimethylamino dimethacrylate, acrylated amine oligomer acrylate.

6. A coverlay substrate in accordance with claim 1 wherein the adhesive layer further comprises an adhesion promoter selected from a group consisting of benzotriazole, 5-chloro-benzotriazole, 1-chloro-benzotriazole, 1-carboxy-benzotriazole, 1-hydroxy-benzotriazole, 1,2-napthotriazole, benzimidazole, mercaptobenzimidazole, 5-nitro-2-mercaptobenimidazole, 5-amino-2-mercyptobenzimidazole, 2-amino-benzimidazole, 5-methyl-benzimidazole, 4,5-diphenyl-benzimidazole, 2-guanadino-benzimidazole, benzothiazole, 2-amino-6-methyl-benzothiazole, 2-mercapto-benzothiazole, 2-methyl-benzothiazole, benzoxazole, 2-mercaptobenzoxazole, 2-mercaptothiazoline, benzotriazole, 3-amino-1,2,4-triazole, 1H-1,2,4-triazole-3-thiol, 5-amino-1,3,4-thiodiazole-2-thiol, 4-mercapto-1H-pyrazolo[3,4-d]pyrimidine, 4-hydroxy-pyrazolo[3,4-d]pyrimidene, 5-amino-tetrazole monohydrate, tolutriazole, 1-phenyl-3-mercaptotetrazole, 2-amino-thiazole, thio-benzanilide, 2-amino-5-mercaptothiophene, 5-amino-1,3,4-thiodiazole-2-thiol, benzotriazole, 5-chloro-benzotriazole, 1-chloro-benzotriazole, 1-carboxy-benzotriazole, 1-hydroxy-benzotriazole, 2-mercaptobenzoxazole, 1H-1,2,4-triazole-3-thiol, and mercaptobenzimidazole.

7. A coverlay substrate in accordance with claim 1, wherein at least a portion of the adhesive layer is bonded to a flexible printed circuit.

8. A coverlay substrate in accordance with claim 1, wherein the adhesive layer and the cover layer are imidized to provide a polyimide adhesive layer and a polyimide cover layer.

9. A coverlay substrate in accordance with claim 8, wherein the cover layer polyimide layer comprises a polyimide having an in-plane GTE between and including any two of the following numbers 5, 10, 15, 20, 25 and 30 ppm/° C. measure at 30° C.

10. A coverlay substrate in accordance with claim 8, wherein the adhesive layer is bonded to a circuitized electronic substrate.

11. A coverlay substrate in accordance with claim 8, wherein the adhesive layer is bonded to a metal.

12. A coverlay substrate in accordance with claim 1 wherein the photo-monomer additionally comprises a non-amine containing photo-monomer selected from the group consisting of hexamethylene glycol diacrylate, triethylene glycol diacrylate, polyethylene glycol (200) diacrylate, cyclohexane dimethanol diacrylate, oxyethylated phenol acrylate, tripropylene glycol diacrylate, trimethylolpropane triacrylate, polyoxyethylated trimethylolpropane triacrylate, poly-oxypropylated trimethylolpropane triacrylate, pentaerythritol triacrylate, and pentaerythritol tetraacrylate.

* * * * *

UNITED STATES PATENT AND TRADEMARK OFFICE
CERTIFICATE OF CORRECTION

PATENT NO. : 7,579,134 B2  Page 1 of 1
APPLICATION NO. : 11/080608
DATED : August 25, 2009
INVENTOR(S) : Dueber et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 825 days.

Signed and Sealed this

Fourteenth Day of September, 2010

David J. Kappos
*Director of the United States Patent and Trademark Office*